(12) United States Patent
Wu

(10) Patent No.: US 11,574,921 B2
(45) Date of Patent: Feb. 7, 2023

(54) THREE-DIMENSIONAL MEMORY DEVICE AND FABRICATION METHOD THEREOF

(71) Applicant: Yangtze Memory Technologies Co., Ltd., Wuhan (CN)

(72) Inventor: Linchun Wu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 225 days.

(21) Appl. No.: 16/896,571

(22) Filed: Jun. 9, 2020

(65) Prior Publication Data

US 2021/0296351 A1 Sep. 23, 2021

Related U.S. Application Data

(63) Continuation of application No. PCT/CN2020/080317, filed on Mar. 20, 2020.

(51) Int. Cl.

| | |
|---|---|
| *H01L 27/11* | (2006.01) |
| *H01L 27/11582* | (2017.01) |
| *G11C 16/04* | (2006.01) |
| *G11C 16/16* | (2006.01) |
| *G11C 16/26* | (2006.01) |
| *H01L 27/11524* | (2017.01) |
| *H01L 27/11556* | (2017.01) |
| *H01L 27/1157* | (2017.01) |

(52) U.S. Cl.
CPC .... *H01L 27/11582* (2013.01); *G11C 16/0483* (2013.01); *G11C 16/16* (2013.01); *G11C 16/26* (2013.01); *H01L 27/1157* (2013.01); *H01L 27/11524* (2013.01); *H01L 27/11556* (2013.01)

(58) Field of Classification Search
CPC ......... H01L 27/11582; H01L 27/11556; H01L 27/1157; H01L 27/11551; H01L 27/11524
See application file for complete search history.

(56) References Cited

U.S. PATENT DOCUMENTS

| | | | |
|---|---|---|---|
| 2005/0124116 A1 | 6/2005 | Hsu et al. | |
| 2011/0002178 A1* | 1/2011 | Hwang | H01L 29/6656 257/314 |
| 2016/0329101 A1* | 11/2016 | Sakakibara | H01L 27/11556 |

(Continued)

FOREIGN PATENT DOCUMENTS

| | | |
|---|---|---|
| CN | 105470260 A | 4/2016 |
| CN | 107591407 A | 1/2018 |

(Continued)

*Primary Examiner* — Jaehwan Oh
(74) *Attorney, Agent, or Firm* — Anova Law Group, PLLC

(57) ABSTRACT

Three-dimensional (3D) NAND memory devices and methods are provided. In one aspect, a fabrication method includes depositing a cover layer over a substrate, depositing a layer stack over the cover layer, performing a first epitaxial growth to deposit a first epitaxial layer on a side portion of a channel layer that extends through the layer stack, removing the cover layer to expose a portion of the substrate, performing a second epitaxial growth to deposit a second epitaxial layer on the portion of the substrate, and performing a third epitaxial growth to deposit a third epitaxial layer on the second epitaxial layer. The second and third epitaxial layers are configured to provide separate electrical current paths for an erase operation and a read operation.

8 Claims, 19 Drawing Sheets

(56) References Cited

U.S. PATENT DOCUMENTS

| | | | |
|---|---|---|---|
| 2017/0025421 A1* | 1/2017 | Sakakibara | H01L 29/40114 |
| 2017/0110471 A1 | 4/2017 | Yoshimizu et al. | |
| 2017/0352669 A1 | 12/2017 | Sharangpani et al. | |
| 2018/0006052 A1* | 1/2018 | Hwang | H01L 27/11582 |
| 2018/0138194 A1 | 5/2018 | Shigemura et al. | |
| 2020/0051993 A1 | 2/2020 | Rabkin et al. | |
| 2020/0051997 A1 | 2/2020 | Park | |
| 2021/0225865 A1* | 7/2021 | Wu | H01L 27/1157 |
| 2021/0376094 A1* | 12/2021 | Lin | H01L 29/0847 |
| 2021/0408230 A1* | 12/2021 | More | H01L 29/1079 |
| 2022/0140112 A1* | 5/2022 | Fulford | H01L 21/823412 |
| | | | 257/329 |

FOREIGN PATENT DOCUMENTS

| | | |
|---|---|---|
| CN | 107887395 A | 4/2018 |
| CN | 111276490 A | 6/2020 |
| EP | 3486951 A1 | 5/2019 |
| JP | 201946916 A | 3/2019 |
| TW | I609466 B | 12/2017 |
| TW | I627771 B | 6/2018 |
| TW | I663732 B | 6/2019 |
| TW | I665783 B | 7/2019 |
| TW | I682525 B | 1/2020 |
| TW | I685949 B | 2/2020 |
| TW | I685953 B | 2/2020 |
| WO | 2016209615 A1 | 12/2016 |

\* cited by examiner

THREE-DIMENSIONAL MEMORY DEVICE AND FABRICATION METHOD THEREOF

CROSS-REFERENCE TO RELATED APPLICATION

This application is a continuation of International Application No. PCT/CN2020/080317, filed on Mar. 20, 2020, the entire content of which is incorporated herein by reference.

FIELD OF THE TECHNOLOGY

This application relates to the field of semiconductor technology and, specifically, to a three-dimensional (3D) semiconductor memory device and fabrication method thereof.

BACKGROUND OF THE DISCLOSURE

NAND is a non-volatile type of memory that does not require power to retain stored data. The growing demands of consumer electronics, cloud computing, and big data bring about a constant need of NAND memories of larger capacity and better performance. As conventional two-dimensional (2D) NAND memory approaches its physical limits, three-dimensional (3D) NAND memory is now playing an important role. 3D NAND memory uses multiple stack layers in a single chip to achieve higher density, higher capacity, faster performance, lower power consumption, and better cost efficiency.

In a 3D NAND memory device, NAND memory cells belonging to a block are electrically connected to a common p-doped silicon well (p-well). When the NAND memory cells are reset in a block erase operation, the p-well is positively biased against word lines of the NAND memory cells. Such a p-well structure provides an electrical current path not only for the block erase operation, but also for the read operation. However, during the read operation, the p-well is negatively biased against a selected word line. The reverse bias often causes design difficulty for the bottom selective gate (BSG). The disclosed methods and systems are directed to solve one or more problems set forth above and other problems.

SUMMARY

In one aspect of the present disclosure, a fabrication method for a three-dimensional (3D) NAND memory device includes depositing a cover layer over a substrate, depositing a layer stack over the cover layer, performing a first epitaxial growth to deposit a first epitaxial layer on a side portion of a channel layer that extends through the layer stack, removing the cover layer to expose a portion of the substrate, performing a second epitaxial growth to deposit a second epitaxial layer on the portion of the substrate, and performing a third epitaxial growth to deposit a third epitaxial layer on the second epitaxial layer. The layer stack includes first stack layers and second stack layers that are alternately stacked. The second and third epitaxial layers are doped with different types of dopants. The second and third epitaxial layers are configured to provide separate electrical current paths for an erase operation and a read operation of the 3D memory device.

In another aspect of the present disclosure, another fabrication method for a 3D NAND memory device includes depositing a layer stack over a substrate, performing a first epitaxial growth to deposit a first epitaxial layer on a side portion of a channel layer that extends through the layer stack, removing a cover layer to expose a portion of the substrate, performing a second epitaxial growth to deposit a second epitaxial layer on the portion of the substrate, and performing a third epitaxial growth to deposit a third epitaxial layer on the second epitaxial layer. The layer stack includes first stack layers and second stack layers that are alternately stacked. The second and third epitaxial layers are doped with different types of dopants. The second and third epitaxial layers are configured to provide separate electrical current paths for an erase operation and a read operation of the 3D memory device.

In another aspect of the present disclosure, a 3D NAND memory device includes a substrate, a layer stack over the substrate, a first epitaxial layer on a side portion of a channel layer that extends through the layer stack, a second epitaxial layer on the substrate, and a third epitaxial layer on the second epitaxial layer. The layer stack includes first stack layers and second stack layers that are alternately stacked. The second and third epitaxial layers are doped with different types of dopants. The second epitaxial layer is configured to provide a first electrical current path for an erase operation of the 3D NAND memory device. The third epitaxial layer is configured to provide a second electrical current path for a read operation of the 3D NAND memory device.

Other aspects of the present disclosure can be understood by those skilled in the art in light of the description, the claims, and the drawings of the present disclosure.

DETAILED DESCRIPTION

The following describes the technical solutions in the embodiments of the present disclosure with reference to the accompanying drawings. Wherever possible, the same reference numbers will be used throughout the drawings to refer to the same or like parts. Apparently, the described embodiments are merely some but not all the embodiments of the present disclosure. Features in various embodiments may be exchanged and/or combined. Other embodiments obtained by a person skilled in the art based on the embodiments of the present disclosure without creative efforts shall fall within the scope of the present disclosure.

Figure 1:
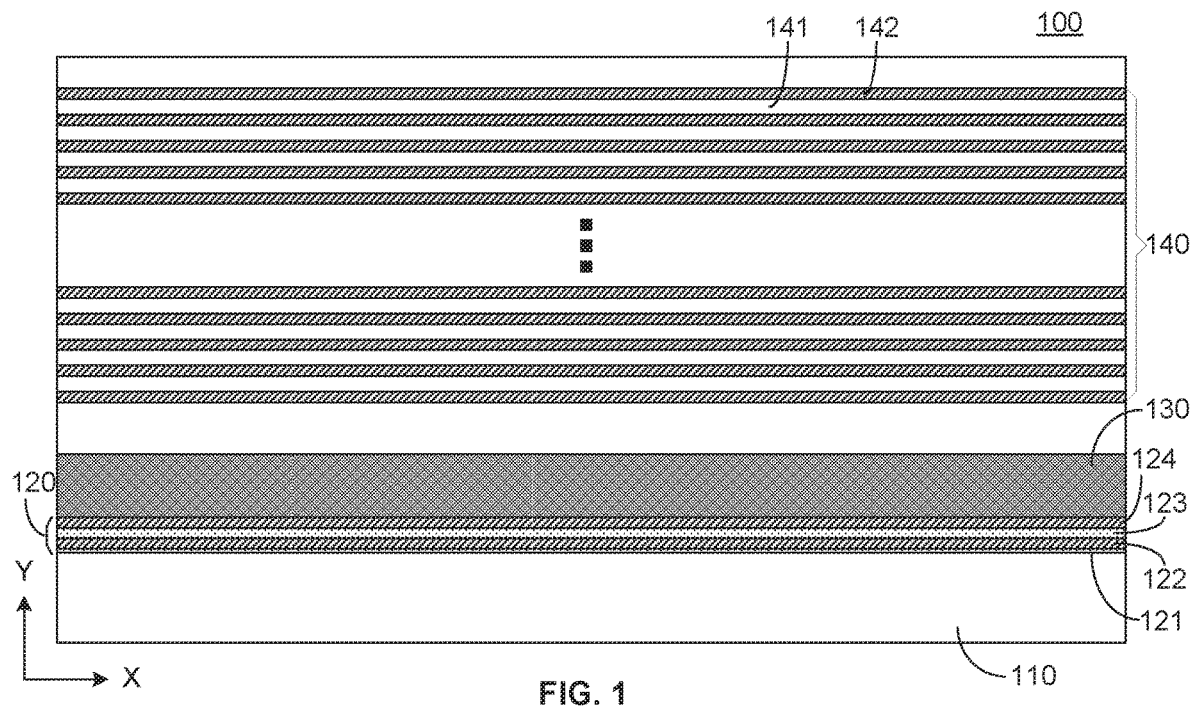
FIG. 1 illustrates schematically a cross-sectional view of a three-dimensional (3D) memory device in an exemplary fabrication process according to embodiments of the present disclosure.

FIGS. 1-18 schematically show a fabrication process of an exemplary 3D memory device 100 according to embodiments of the present disclosure. Among FIGS. 1-18, cross-sectional views are in the X-Y plane and top views are in the X-Z plane. As shown in FIG. 1, the 3D memory device 100 includes a substrate 110. In some embodiments, the substrate 110 may include a single crystalline silicon layer. In some other embodiments, the substrate 110 may include another semiconductor material such as germanium, gallium arsenide, indium phosphide, polycrystalline silicon (polysilicon), etc. In some other embodiments, the substrate 110 may include an electrically non-conductive material such as glass, a plastic material, or a ceramic material. In the following descriptions, as an example, the substrate 110 includes an undoped or light doped single crystalline silicon layer. In some other embodiments, the substrate 110 may be doped differently with p-type or n-type dopants. When the substrate 110 includes glass, plastic, or ceramic material, the substrate 110 may further include a thin layer of polysilicon deposited on the glass, plastic, or ceramic material, such that the substrate 110 may be processed like a polysilicon substrate.

As shown in FIG. 1, a cover layer 120 may be deposited over the substrate 110. The cover layer 120 may include layers 121, 122, 123, and 124 deposited in a direction perpendicular to the top surface of the substrate 110. The layers 121, 122, 123, and 124 may be dielectric and include silicon oxide, silicon nitride, silicon oxide, and silicon nitride, respectively. The layers 121-124 may be sequentially deposited by chemical vapor deposition (CVD), physical vapor deposition (PVD), atomic layer deposition (ALD), or a combination of two or more of these methods. In some other embodiments, the layers 121-124 may include different materials. In addition, in some other embodiments, a single layer, instead of four layers, may be formed on the substrate 110 and used as the cover layer, which will be discussed later.

Over a top surface of the layer 124, a sacrificial layer 130 may be deposited. The sacrificial layer 130 may include a dielectric material, a semiconductive material, or a conductive material. For example, the layer 130 is a polysilicon layer, which may be deposited by a CVD and/or PVD process. After the polysilicon layer 130 is formed, a layer stack 140 may be deposited. The layer stack 140 includes multiple pairs of stack layers 141 and 142, i.e., the layers 141 and 142 may be stacked alternately.

In some embodiments, the layers 141 and 142 may include a first dielectric material and a second dielectric material that is different from the first dielectric material, respectively. The alternating layers 141 and 142 may be deposited via CVD, PVD, ALD, or a combination of two or more of these processes. In discussions bellow, exemplary materials for the layers 141 and 142 are silicon oxide and silicon nitride, respectively. In some other embodiments, different materials may be used to form the alternating layers 141 and 142. For example, the layers 141 and 142 may include dielectric materials other than silicon oxide and/or silicon nitride. Further, in some other embodiments, the layers 141 and 142 may include a dielectric layer and a conductive layer. The conductive layer may include, e.g., tungsten (W), cobalt (Co), copper (Cu), aluminum (Al), doped silicon, or silicide. In discussions below, as an example, the layers 141 and 142 include silicon oxide and silicon nitride, respectively.

Figure 2:
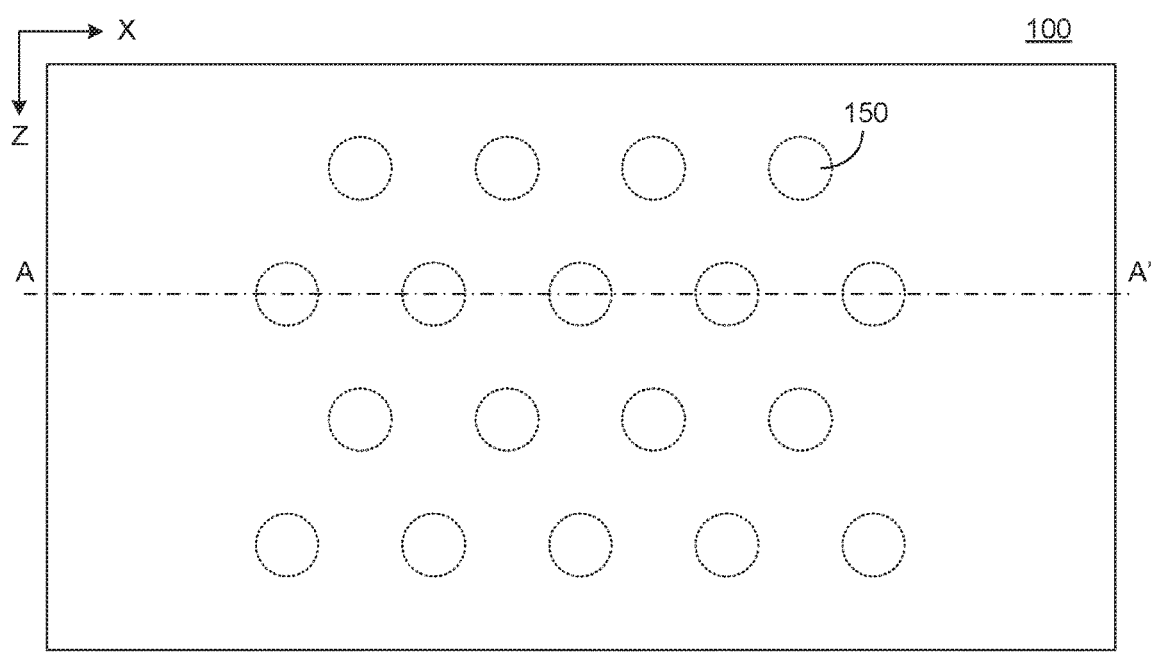
FIGS. 2 and 3 illustrate schematically a top view and a cross-sectional view of the 3D memory device shown in FIG. 1 after channel holes are formed according to embodiments of the present disclosure.
Figure 3:
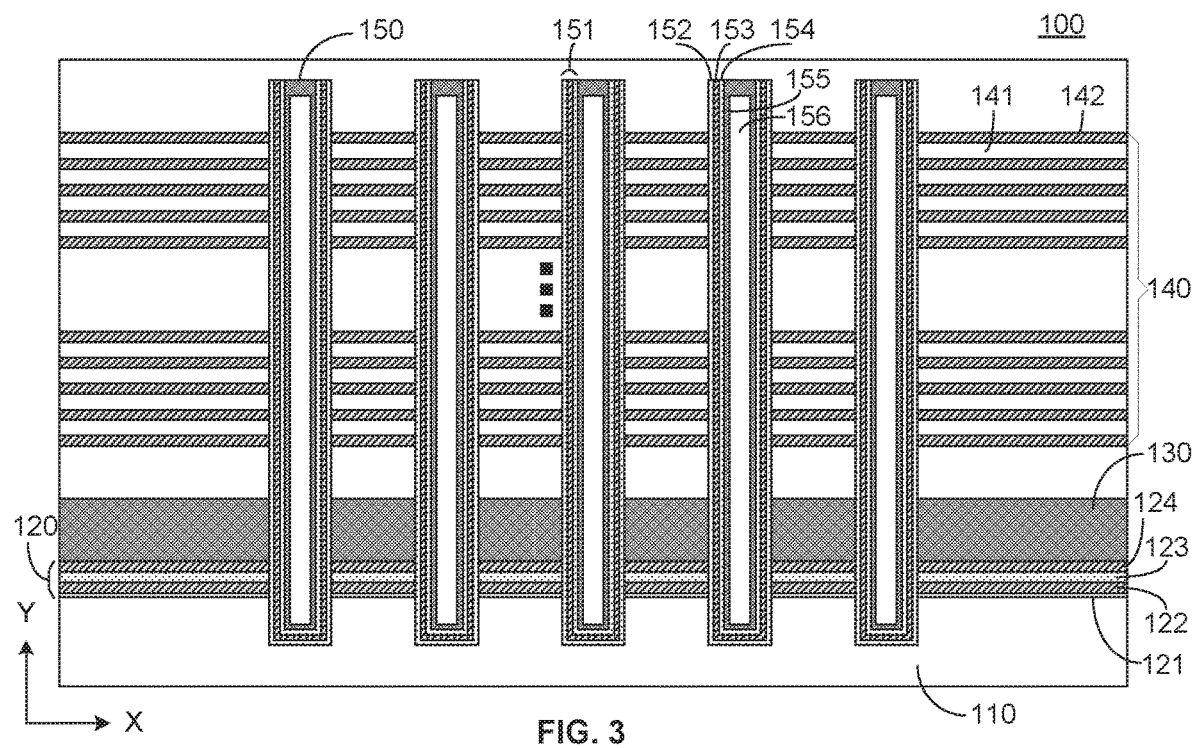

FIGS. 2 and 3 schematically show a top view and a cross-sectional view of the 3D memory device 100 after channel holes 150 are formed and filled according to embodiments of the present disclosure. The quantity, dimensions, and arrangement of the channels 150 shown in the figures are only exemplary and for description of structures and fabrication methods of the device 100. The channel holes 150 are configured to extend in the Y direction and form a pattern in the X-Z plane. The cross-sectional view shown in FIG. 3 is taken along a line AA' of FIG. 2. Thus, FIG. 3 only illustrates some of the channels holes 150 of FIG. 2 that are in the cross section in the X-Y plane.

The channel holes 150 may be formed by, e.g., a dry etch process or a combination of dry and wet etch processes. Other fabrication processes may also be performed, such as a patterning process involving lithography, cleaning, and/or chemical mechanical polishing (CMP), while detailed descriptions of these processes are omitted for simplicity. The channel holes 150 may have a cylinder shape or pillar shape that extends through the layer stack 140 and the layers 130 and 121-124, and partially penetrates the substrate 110. After the channel hole 150 are formed, a functional layer 151 may be deposited on the sidewall of the channel hole. The functional layer 151 may include a blocking layer 152 on the sidewall of the channel hole to block an outflow of charges, a storage layer 153 on a surface of the blocking layer 152 to store charges during an operation of the 3D memory device 100, and a tunnel insulation layer 154 on a surface of the storage layer 153. The blocking layer 152 may include silicon oxide or a high-k dielectric material such as aluminum oxide or hafnium oxide. The storage layer 153 may include polysilicon, silicon nitride, silicon oxynitride, or nanocrystalline silicon. The tunnel insulation layer 154 may include silicon oxide or a high-k dielectric material such as aluminum oxide or hafnium oxide.

In some embodiments, the functional layer 151 may include an oxide-nitride-oxide (ONO) structure. For example, a composite layer including a silicon oxide layer, a silicon nitride layer, and a silicon oxide layer as the blocking layer 152, the storage layer 153, and the tunnel insulation layer 154, respectively, is described as an example of the functional layer 151. In some other embodiments, the functional layer 151 may include a structure other than the ONO structure.

As shown in FIG. 3, a silicon oxide layer may be deposited on the sidewall of the channel hole 150 as the blocking layer 152. A silicon nitride layer may be deposited on the blocking layer 152 as the storage layer 153 or a charge trap layer. Another silicon oxide layer may be deposited on the storage layer 153 as the tunnel insulation layer 154. On the tunnel insulation layer 154, a polysilicon layer may be deposited as a channel layer 155, also referred to as a "semiconductor channel." In some other embodiments, the channel layer 155 (semiconductor channel) may include amorphous silicon. Like the channel holes, the channel layers 155 (semiconductor channels) also extend through the layer stack 140 and into the substrate 110. A portion of each functional layer 151 is configured between a portion of one of the stack layers 141 and 142 and a portion of one of the channel layers 155. The blocking layer 152, the storage layer 153, the tunnel insulation layer 154, and the channel layer 155 may be deposited by, e.g., CVD, PVD, ALD, or a combination of two or more of these processes. The channel holes 150 may be filled by an oxide material 156 after the channel layers 155 are formed.

Figure 4:
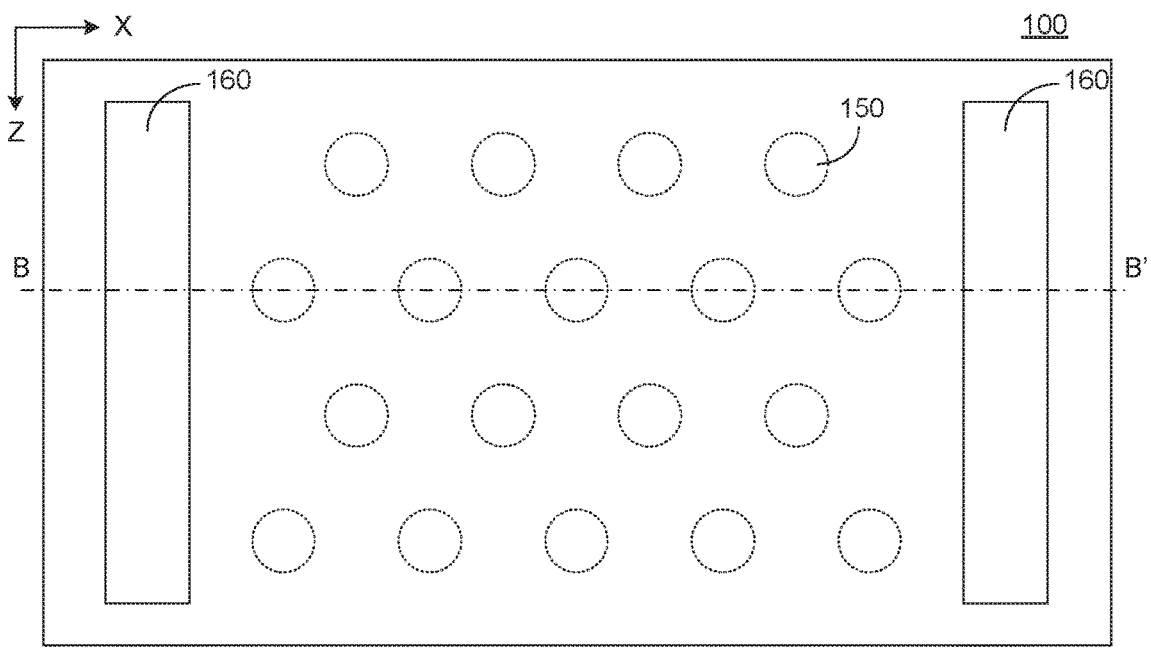
FIGS. 4 and 5 illustrate schematically a top view and a cross-sectional view of the 3D memory device shown in FIGS. 2 and 3 after gate line slit (GLS) is formed in according to embodiments of the present disclosure.
Figure 5:
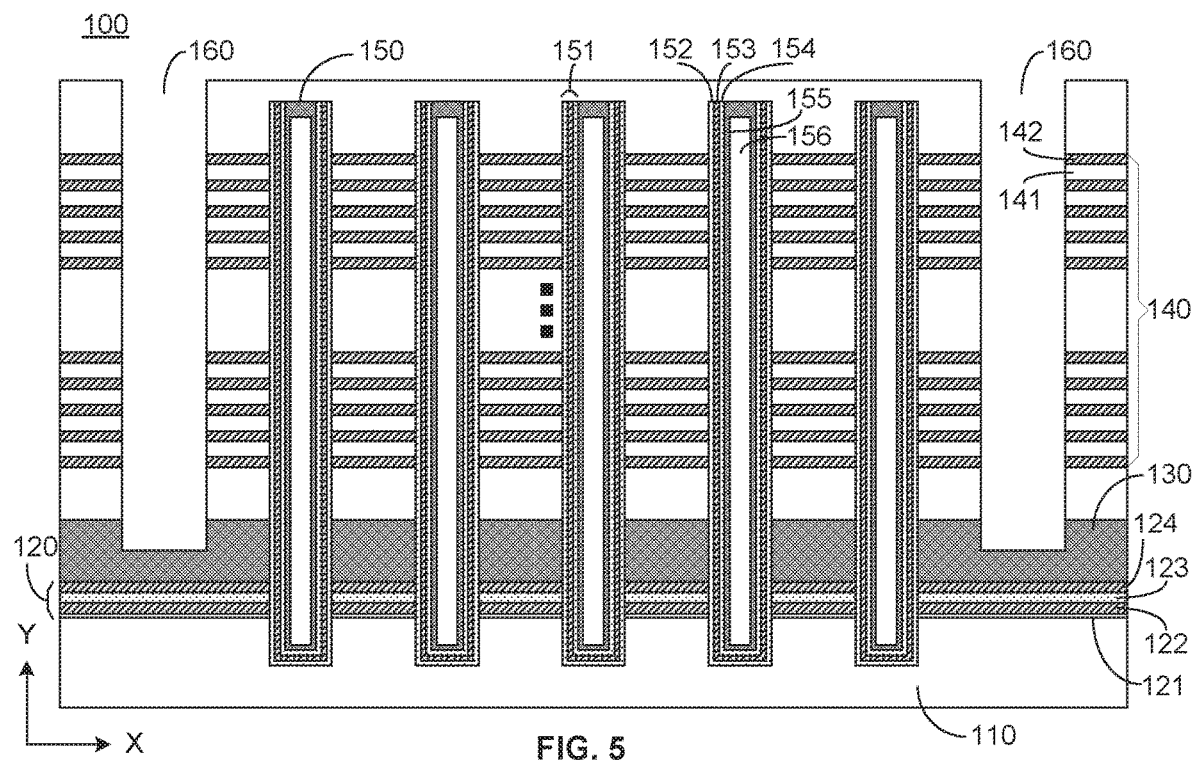

FIGS. 4 and 5 schematically show a top view and a cross-sectional view of the 3D memory device 100 after gate line slits (GLS's) 160 are formed according to embodiments of the present disclosure. The cross-sectional view shown in FIG. 5 is taken along a line BB' of FIG. 4. The GLS 160 may be formed by, e.g., a dry etch process or a combination of dry and wet etch processes. The GLS 160 extends through the layer stack 140 and extends partially in the polysilicon layer 130. As such, at the bottom of the GLS 160, a part of the polysilicon layer 130 is exposed.

Figure 6:
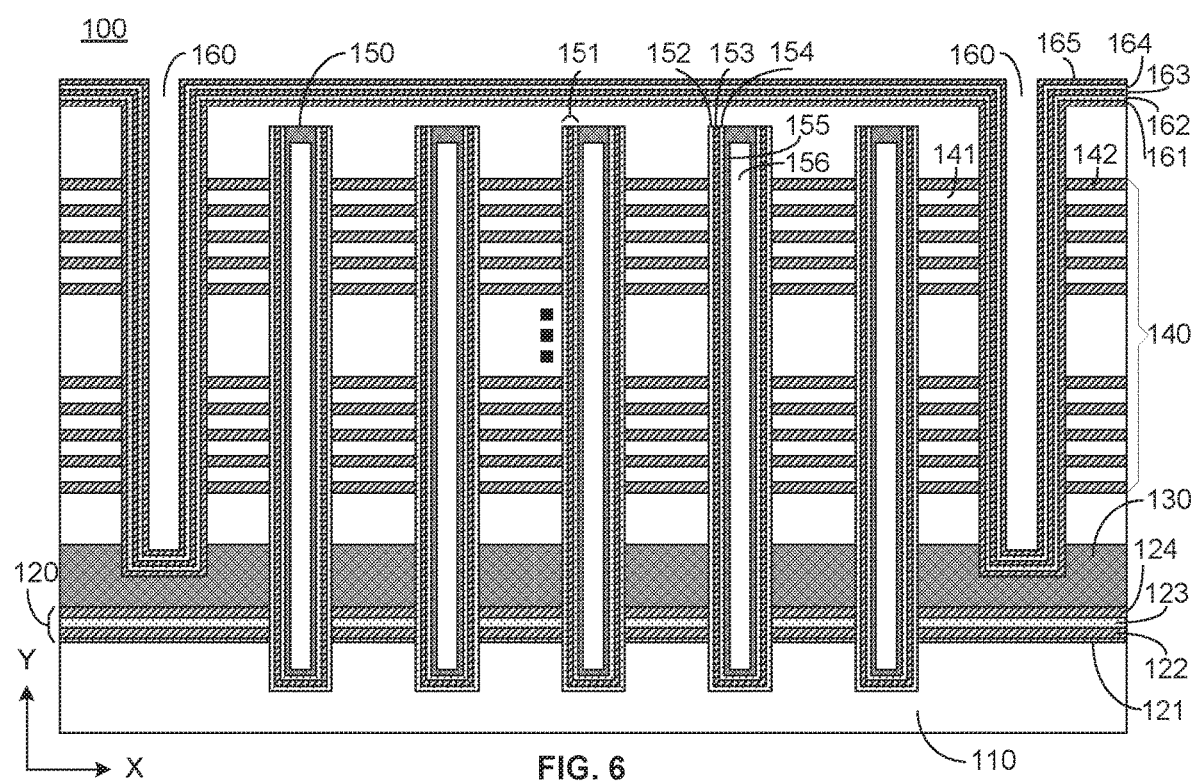
FIGS. 6 and 7 illustrate schematically cross-sectional views of the 3D memory device shown in FIGS. 4 and 5 after GLS spacers are deposited and then etched selectively according to embodiments of the present disclosure.
Figure 7:
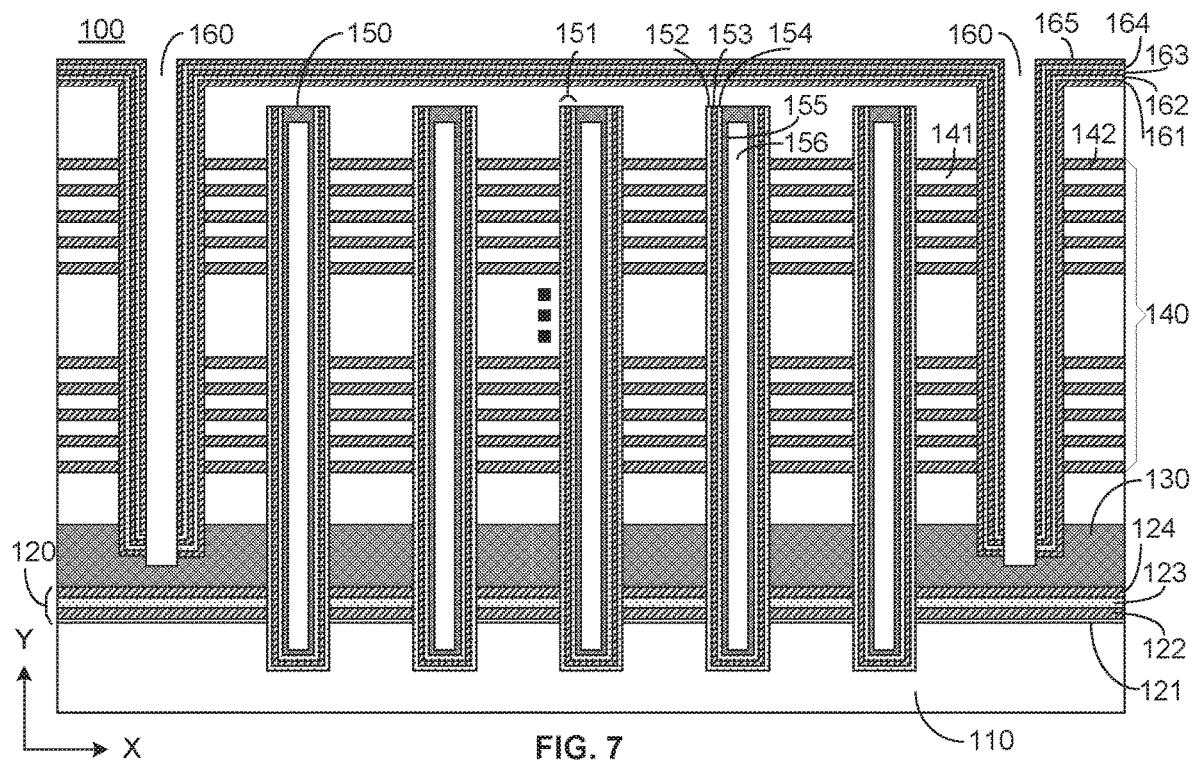

FIGS. 6 and 7 schematically show cross-sectional views of the 3D memory device 100 after GLS spacers are deposited and then selectively etched according to embodiments of the present disclosure. As shown in FIGS. 6 and 7, the GLS spacers include layers 161, 162, 163, 164, and 165 that may be deposited sequentially by CVD, PVD, ALD, or a combination of two or more of these processes. The layers 161, 163, and 165 may include silicon nitride and the layers 162 and 164 may include silicon oxide. After the GLS spacers are deposited, selective etching is performed such that a part of the spacers at the bottom of the GLS is removed by dry etch or a combination of dry etch and wet etch. As such, the polysilicon layer 130 is partially exposed at the bottom of the GLS, as shown in FIG. 7.

Figure 8:
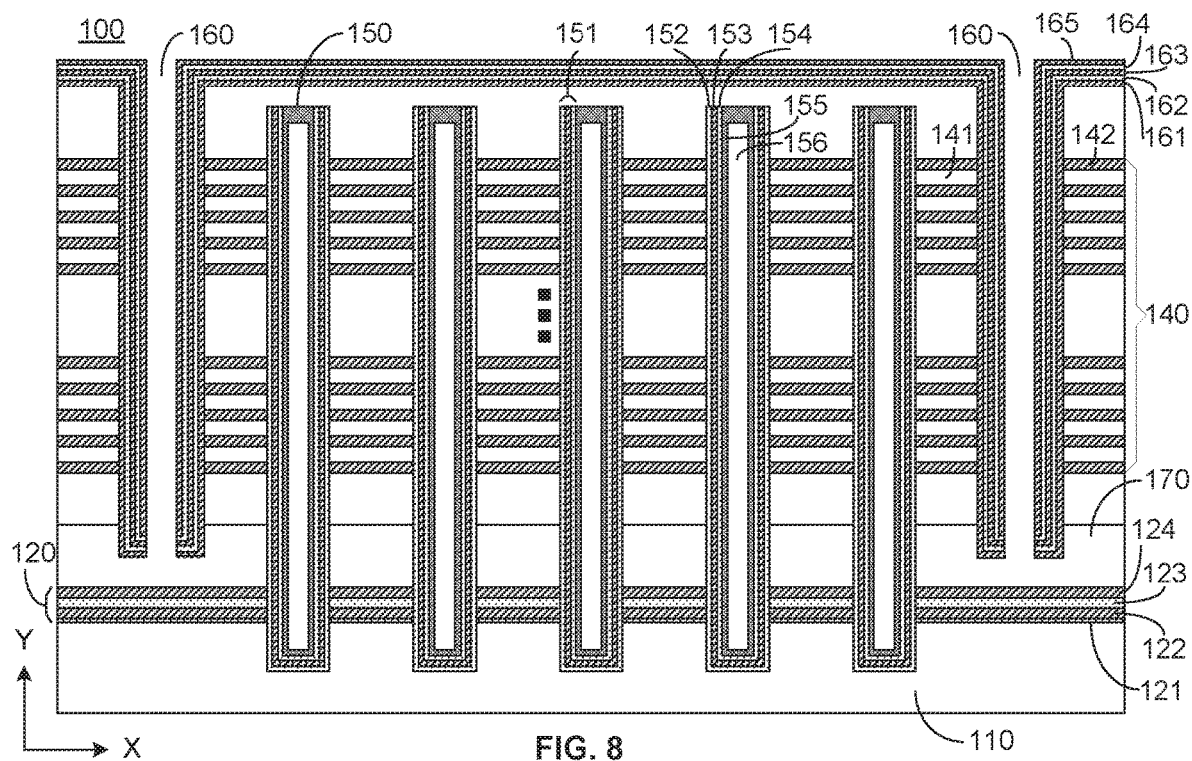
FIGS. 8-12 illustrate schematically cross-sectional views of the 3D memory device shown in FIG. 7 after certain etching steps are performed according to embodiments of the present disclosure.

FIGS. 8-12 each schematically show a cross-sectional view of the 3D memory device 100 after one or more etching steps are performed according to embodiments of the present disclosure. A first selective etch process, e.g., a selective wet etch process, is performed to remove polysilicon materials of the polysilicon layer 130. As illustrated in FIG. 8, removal of the polysilicon materials creates a cavity 170, exposing the silicon nitride layer 124 and bottom portions of the silicon oxide layers (i.e., the blocking layers 152) of the above-described functional layers 151 formed in the channel holes 150.

Figure 9:
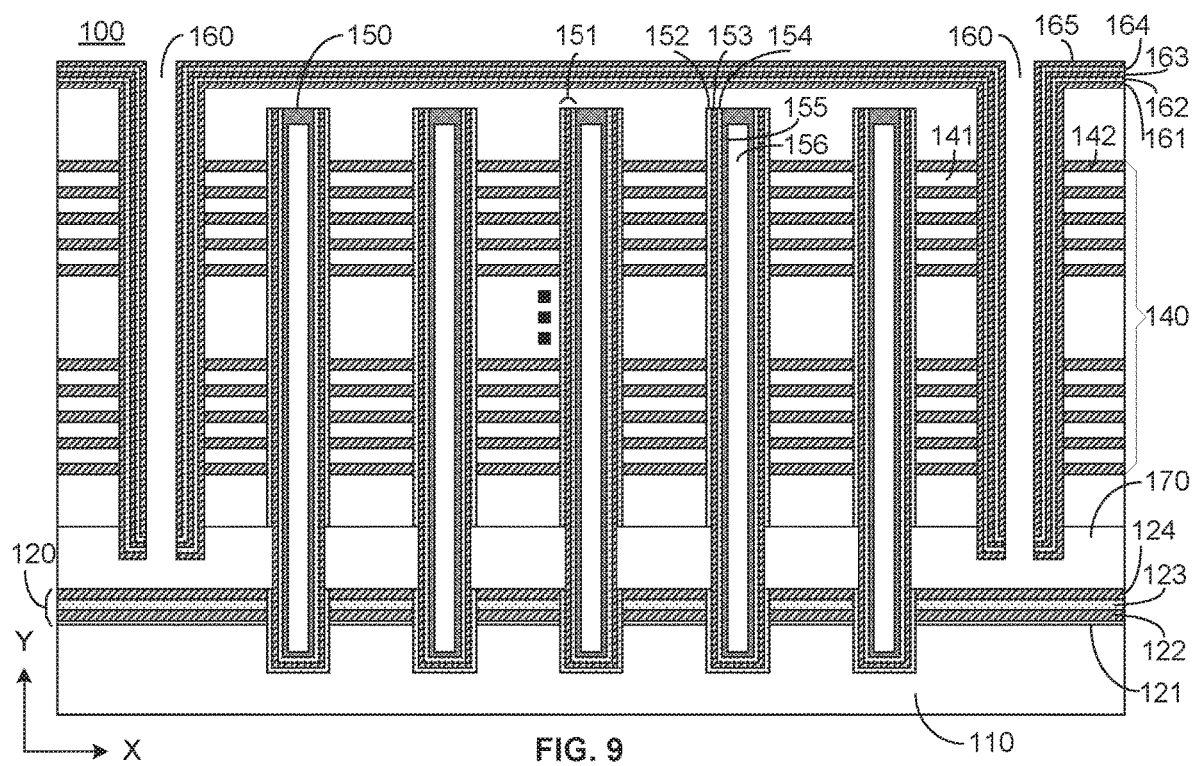

After the polysilicon layer 130 is etched, a second selective etch process, e.g., a selective wet etch process, is performed to remove parts of the silicon oxide layer of the functional layer 151 that are exposed in the cavity 170. As a result, portions of the silicon nitride layers (i.e., the storage layers 153) of the functional layers 151 are exposed, as shown in FIG. 9.

Figure 10:
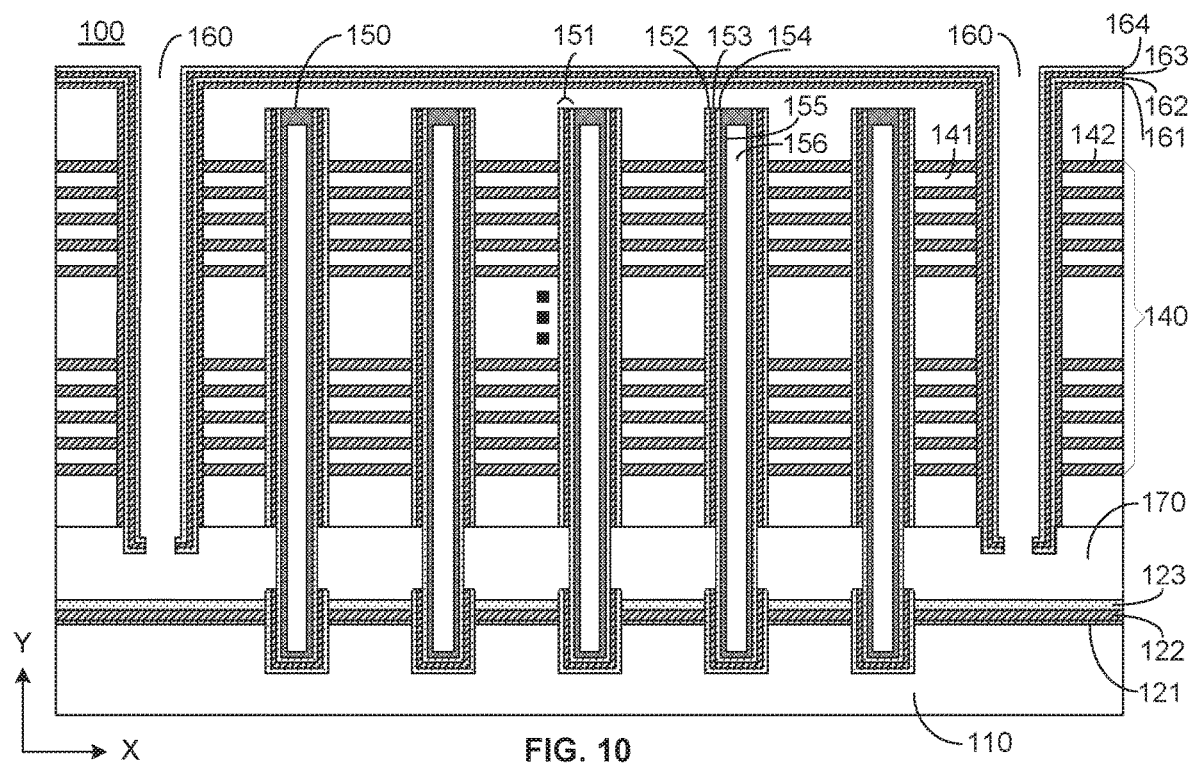

After the portions of the silicon nitride storage layers 153 are exposed, a third selective etch process, e.g., a selective wet etch process, is performed to remove exposed silicon nitride materials, including the exposed portions of the silicon nitride storage layers 153, and the layers 124 and 165. Removal of the exposed silicon nitride materials exposes portions of the silicon oxide layer (i.e., the tunnel insulation layer 154) of the functional layer 151 in the cavity 170, the silicon oxide layer 123 at the bottom of the cavity 170, and the silicon oxide layer 164 of the GLS spacers, as shown in FIG. 10.

Figure 11:
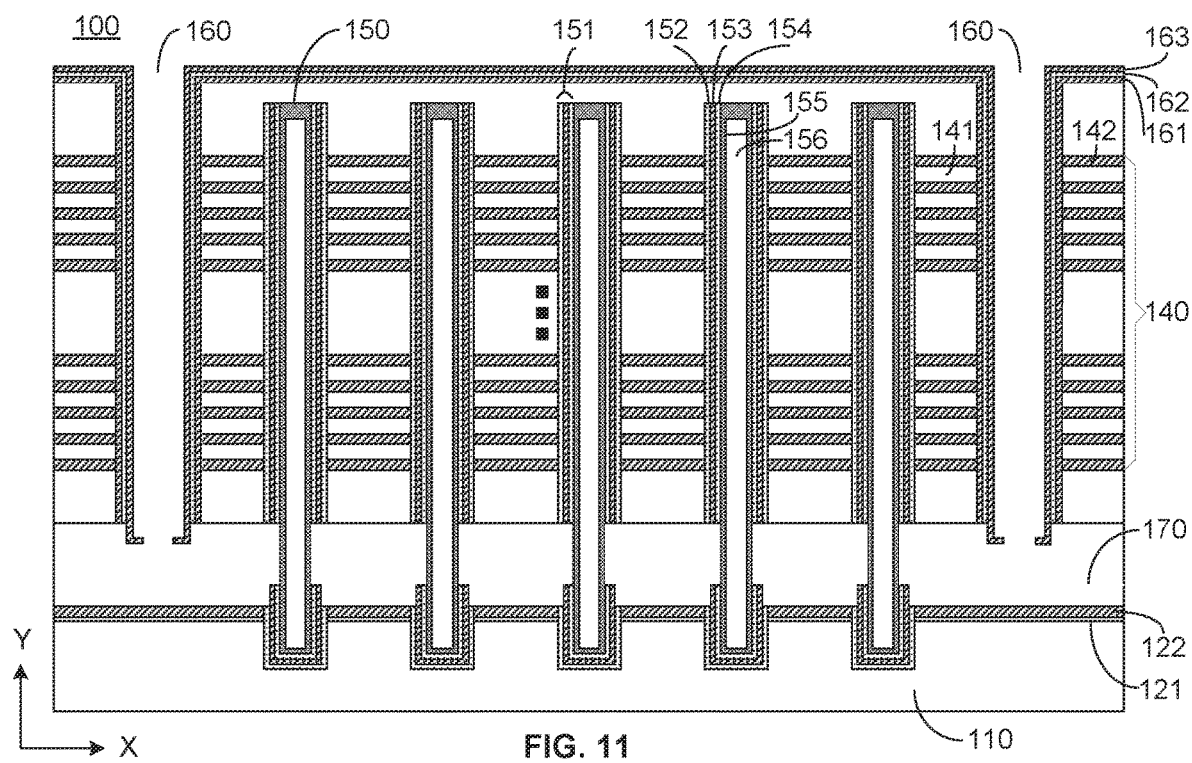

Then, a fourth selective etch process, e.g., a selective wet etch process is performed to remove exposed silicon oxide materials, including the exposed portions of the silicon oxide tunnel insulation layer 154, and the layers 123 and 164. Removal of the exposed silicon oxide materials exposes portions of the polysilicon layer (i.e., the channel layer 155) in the channel holes 150 in the cavity 170, the silicon nitride layer 122 at the bottom of the cavity 170, and the silicon nitride layer 163 of the GLS spacers, as shown in FIG. 11.

Figure 12:
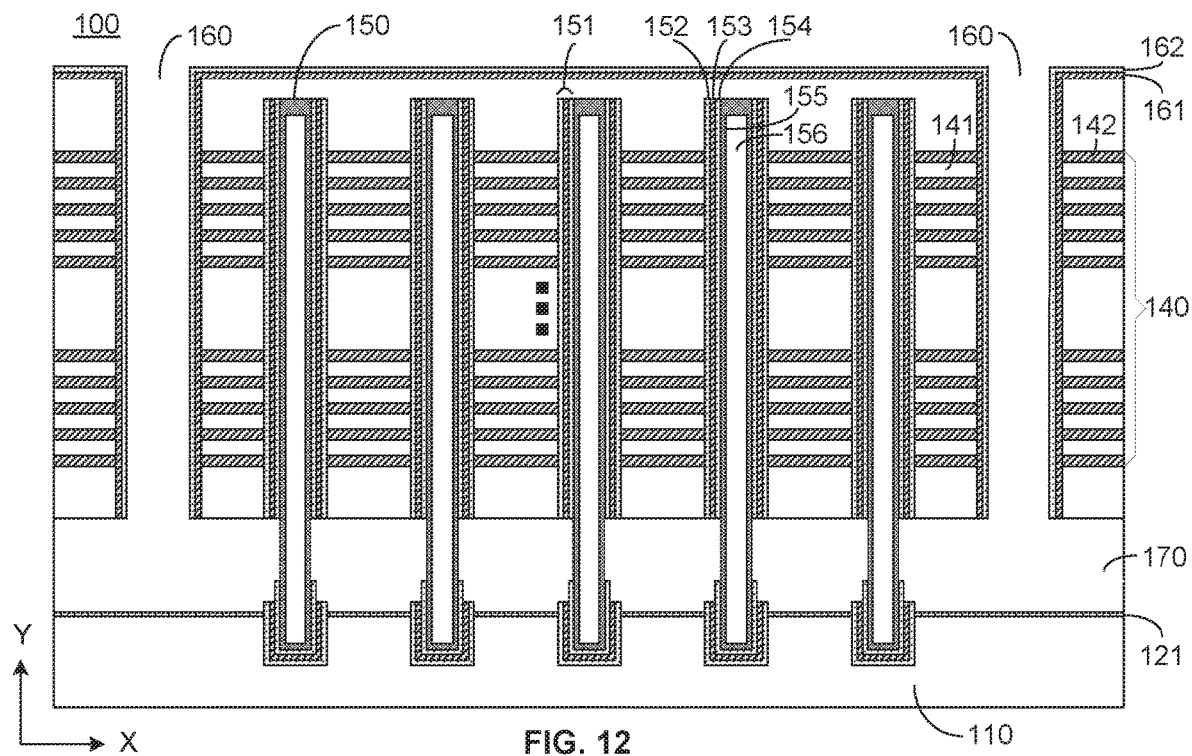

Next, a fifth selective etch process, e.g., a selective wet etch process, is performed to remove exposed silicon nitride materials, including the layers 122 and 163. Removal of the exposed silicon nitride materials exposes the silicon oxide layer 121 at the bottom of the cavity 170 and the silicon oxide layer 162 of the GLS spacers, as shown in FIG. 12. As a result, the portions of the polysilicon channel layers 155 close to the bottom of the channel holes 150 are exposed while other parts of the 3D memory device 100, including the silicon substrate 110, are covered by silicon oxide materials. The exposed portions of the polysilicon channel layers 155 are also the sidewalls of the cavity 170.

Figure 13:
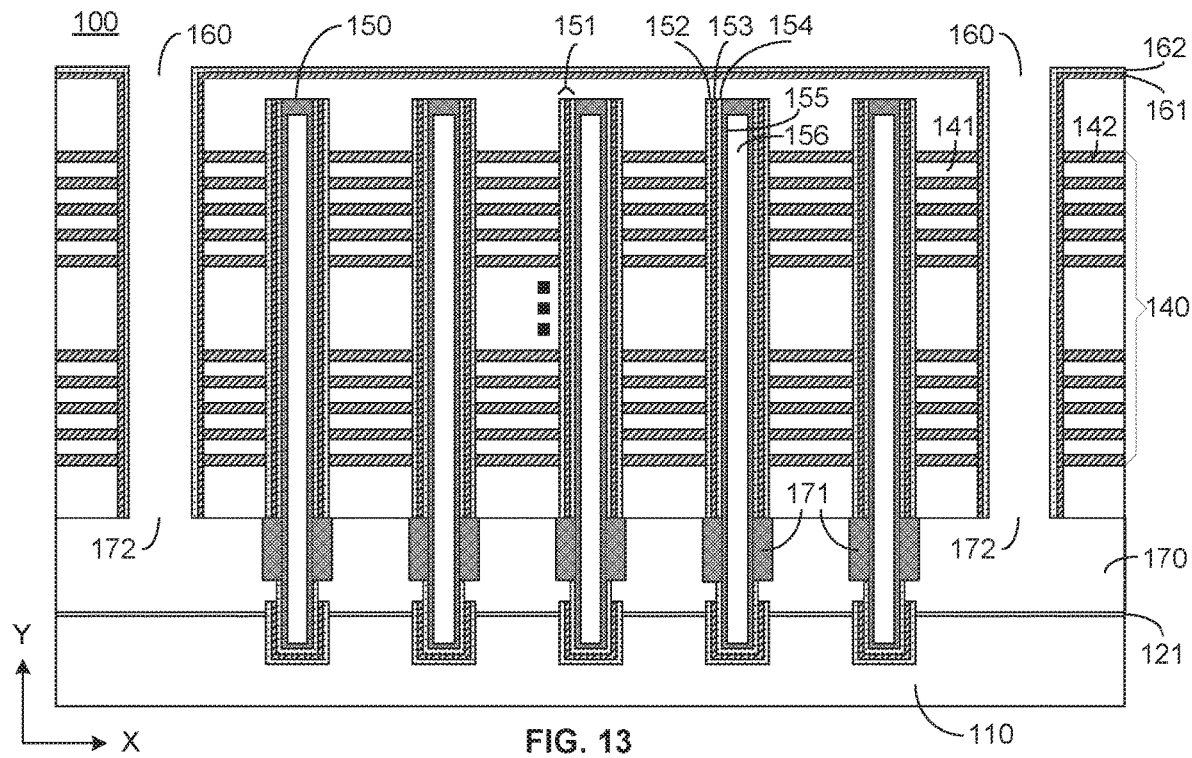
FIG. 13 illustrates schematically a cross-sectional view of the 3D memory device shown in FIG. 12 after a first selective epitaxial growth according to embodiments of the present disclosure.
Figure 14:
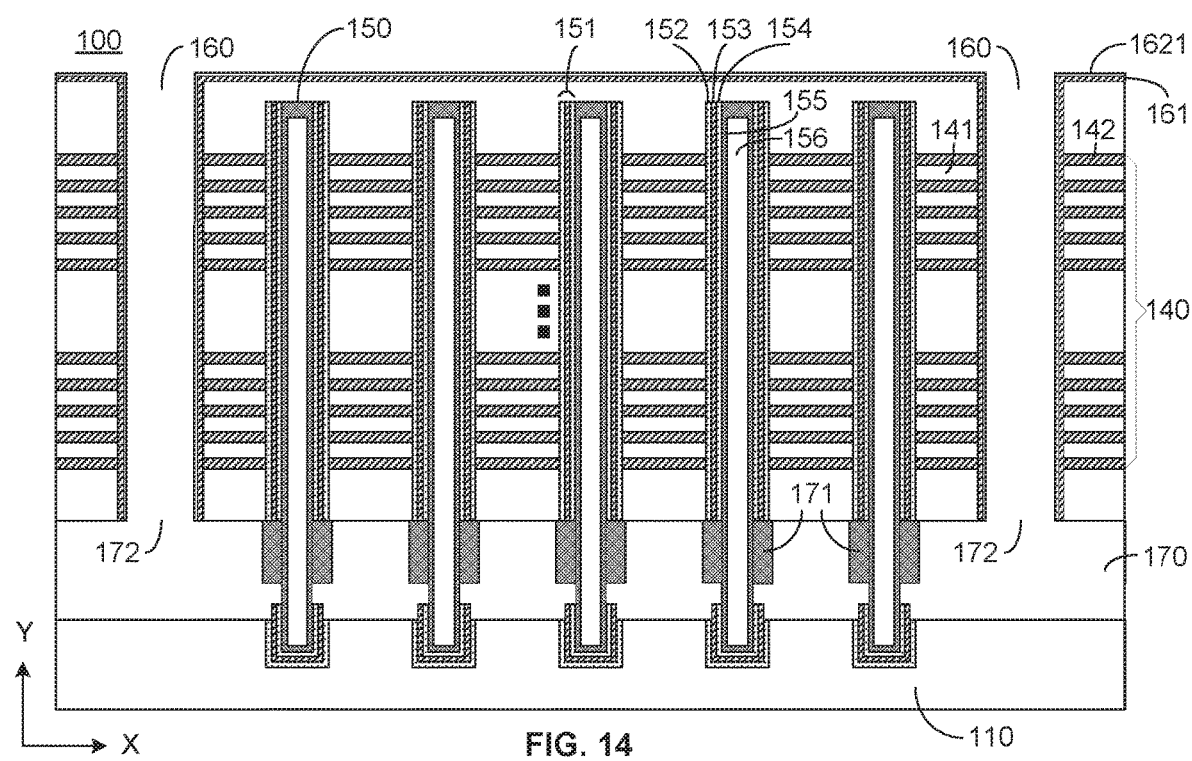
FIG. 14 illustrates schematically a cross-sectional view of the 3D memory device shown in FIG. 13 after an oxide layer is etched on a bottom surface according to embodiments of the present disclosure.
Figure 15:
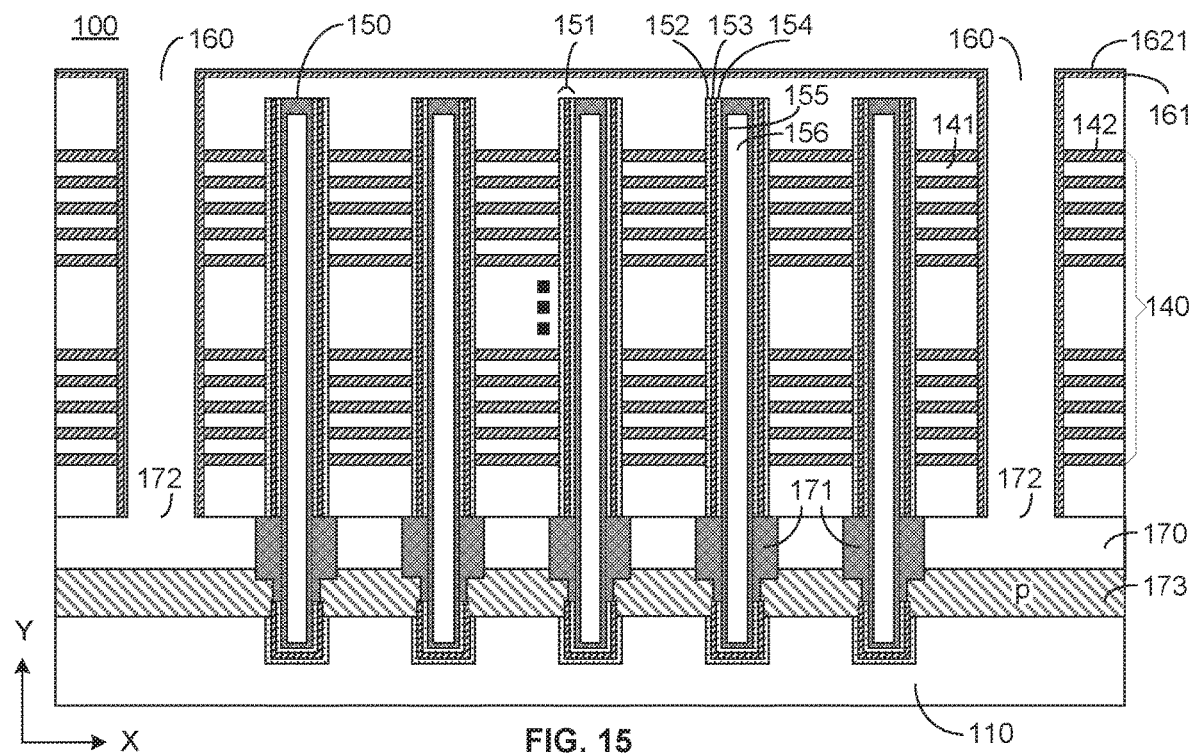
FIGS. 15 and 16 illustrate schematically cross-sectional views of the 3D memory device shown in FIG. 14 after a second and a third selective epitaxial growth according to embodiments of the present disclosure.

FIGS. 13-15 schematically show cross-sectional views of the 3D memory device 100 after a first selective epitaxial growth, an etch step, and a second selective epitaxial growth, respectively, according to embodiments of the present disclosure. The first selective epitaxial growth is performed to deposit polysilicon on the exposed portions of the polysilicon channel layers 155 in the cavity 170, i.e., on the sidewalls of the cavity 170. As other areas are covered by silicon oxide, the process of selective epitaxial growth may only grow polysilicon layers 171 on the exposed portions of the polysilicon channel layers 155, as shown in FIG. 13. As a result, the polysilicon sidewalls of the cavity 170 become thicker. In some embodiments, the polysilicon layer 171 may be undoped. In some other embodiments, the polysilicon layer 171 may be lightly doped with n-type or p-type dopants.

As described above and shown in FIG. 13, because the silicon substrate 110 is covered by the silicon oxide layer 121, polysilicon may be only deposited on the exposed portions of the polysilicon channel layers 155, i.e., the polysilicon sidewalls of the cavity 170, but single crystalline silicon cannot be deposited over the substrate 110. On the other hand, if the silicon oxide 121 does not exist, i.e., both the polysilicon sidewalls of the cavity 170 and the single crystalline silicon substrate 110, which is the bottom of the cavity 170 in this scenario, are exposed, polysilicon may be deposited on the sidewalls and single crystalline silicon may be deposited on the substrate 110, respectively. However, in such a scenario, the growth rate of silicon (e.g., single crystalline silicon) on the substrate 110 can be larger than that of silicon (e.g., polysilicon) on the sidewalls. In particular, silicon layers may grow faster on portions of the substrate 110 that are opposite to openings 172 of the cavity 170 than on the sidewalls that are farther away from the openings 172. Thus, the silicon deposited on the substrate 110 may approach and seal the openings 172 before the thickness of the polysilicon layers deposited on some of the sidewalls that are farther away from the openings 172 reaches a predetermined value. Thus, voids may form around some of the channel holes 150, especially those in the middle between the two openings 172. As the polysilicon sidewall is connected to the channel layer 155 in the channel hole 150, if the polysilicon thickness of the sidewall is below the predetermined value, the channel layer 155 may have a poor electrical connection to the array common source (ACS) and may even cause failure of corresponding NAND memory cells that are connected to the channel layer.

Referring again to FIG. 13, the silicon oxide layer 121 may be removed by, e.g., a selective wet etch process, which exposes the top surface of the substrate 110 at the bottom of the cavity 170. In some embodiments, the layer 162 may be configured sufficiently thicker than the layer 121. As such, only a part of the layer 162 may be removed after the layer 121 is etched away in the selective wet etch. The remaining part of the layer 162 may form a layer 1621, as shown in FIG. 14. Subsequently, a second selective epitaxial growth is performed. Since both the polysilicon sidewalls and the single crystalline silicon substrate 110 are exposed, polysilicon is grown on the sidewalls to make the polysilicon layers 171 thicker, and a single crystalline silicon layer 173 is grown on the substrate 110, as shown in FIG. 15. The polysilicon layer 171 includes two parts formed by the first and second selective epitaxial growth processes, respectively, which can be adjacent and parallel to each other. The single crystalline silicon layer 173 is adjacent and parallel to the top surface of the substrate 110. In the second selective epitaxial growth, the parts of the polysilicon layer 171 that are grown and the single crystalline layer 173 are doped with p-type dopants.

As described above, the layer 171 includes two parts that are grown in two selective epitaxial growth processes. In the first selective epitaxial growth, only the layer 171 is grown. In the second selective epitaxial growth, the layer 171 is thickened and the layer 173 is grown. Further, during the second selective epitaxial growth, the layers 171 and 173 adjoin each other in regions close to the channel layers 155 and become coupled electrically.

Figure 16:
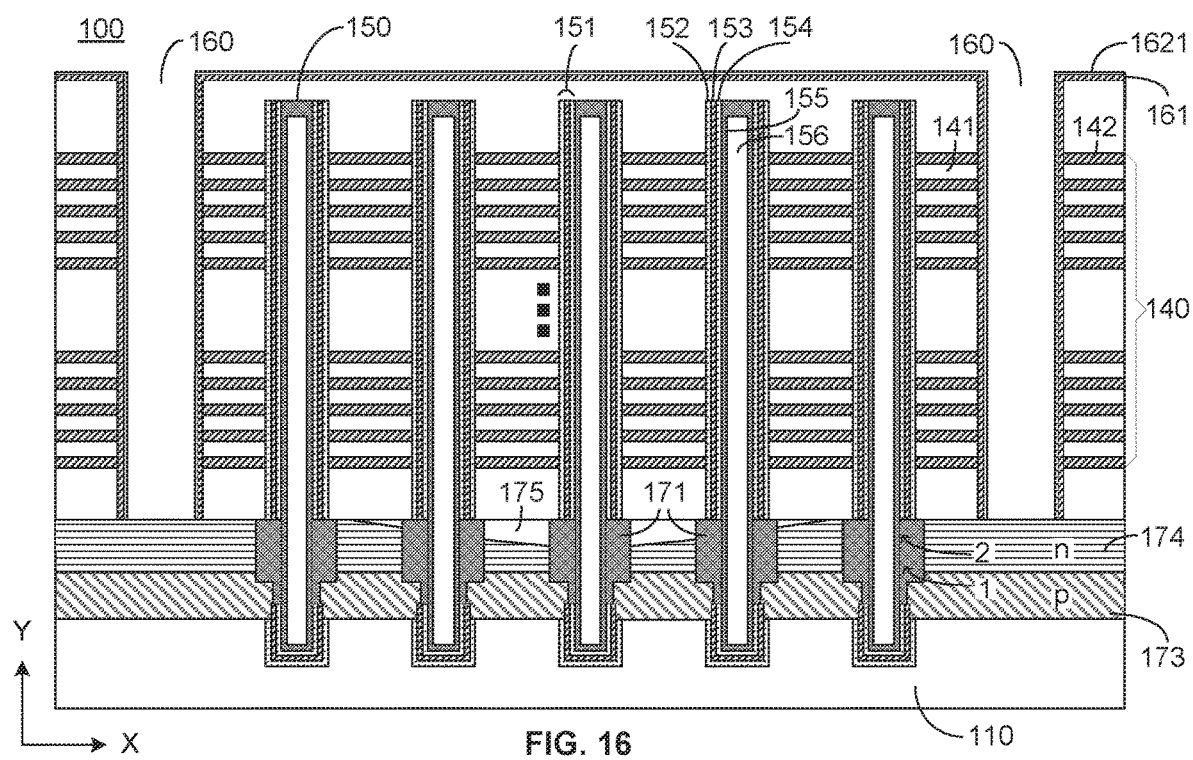

After the second selective epitaxial growth, a third selective epitaxial growth is performed. As both the layer 171 (polysilicon sidewalls) and the single crystalline silicon layer 173 are exposed, polysilicon silicon is grown on the sidewalls to further make the layers 171 thicker, and another single crystalline silicon layer 174 is grown on the layer 173, as shown in FIG. 16. In the third selective epitaxial growth, the parts of the polysilicon layer 171 that are grown and the single crystalline layer 174 are doped with n-type dopants. The layers 171 and 174 adjoin each other in regions close to the channel layers 155 and become electrically coupled. The layers 173 and 174 each are grown in one epitaxial growth process, while the layer 171 is grown in three epitaxial growth processes. The first epitaxial growth is configured to grow the layer 171 exclusively. As such, the final thickness of the layer 171 is unrelated to the growth of the layers 173 and 174 and unrelated to the thickness of the layer 173 and 174.

As some parts of the layer 174 that are opposite to the openings 172 are much closer to the openings, the growth rate of these parts of the layer 174 is the fastest, compared to other parts of the layer 174 and some parts of the layers 171 that are in the middle between the two openings 172. The growth rate difference is so large such that when the openings 172 are filled, voids 175 are formed above some parts of the layer 174, as shown in FIG. 16. Since the polysilicon layers 171 can be grown to reach a certain thickness in the first selective epitaxial growth separately, the electrical connection between the channel layers 155 and the ACS is maintained in spite of the voids 175.

As shown in FIG. 16, the layer 174 may be deposited on a top surface of the layer 173. The layers 173 and 174 contact each other and are electrically coupled. In addition, both the layers 173 and 174 contact and are electrically connected to the polysilicon layers 171. Hence, the layers 171, 173, and 174 adjoin each other and are electrically coupled with each other. That also indicates the layers 171, 173, and 174 electrically contact each other. Since the layers 173 and 174 are p-doped and n-doped respectively, two separate electrical current paths are arranged. A first electrical current path, marked by "1" in FIG. 16, is in the layer 173, while a second electrical current path, marked by "2" in FIG. 16, is in the layer 174. The first electrical current path is configured for the block erase operation of the 3D memory device 100. The second electrical current path is configured for the read operation. Because the read operation uses the second electrical current path in the n-doped layer 174 that is separate from the first electrical current path, the layer 173 (i.e., the p-well) is no longer needed to be negatively biased against a selected word line in the read operation. As such, certain requirements for BSG may be removed and the device reliability may be improved.

Figure 17:
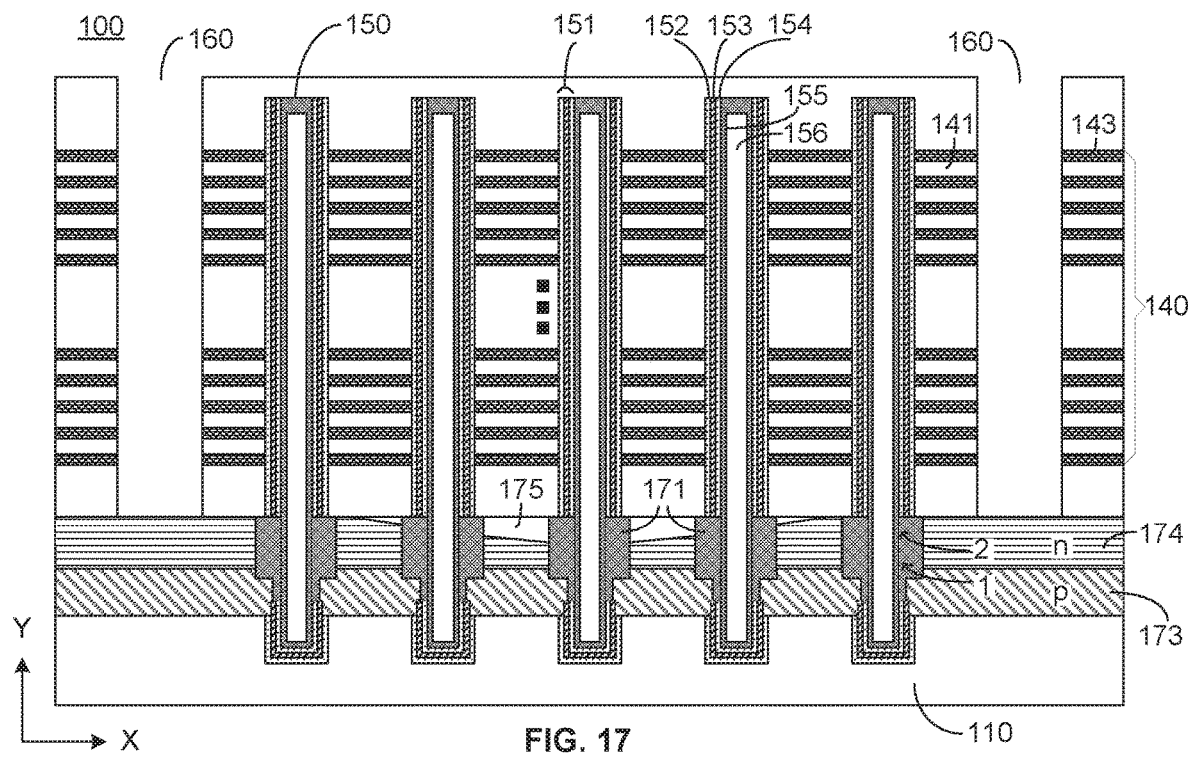
FIGS. 17 and 18 illustrate schematically cross-sectional views of the 3D memory device shown in FIG. 16 after additional fabrication steps are performed according to embodiments of the present disclosure.
Figure 18:
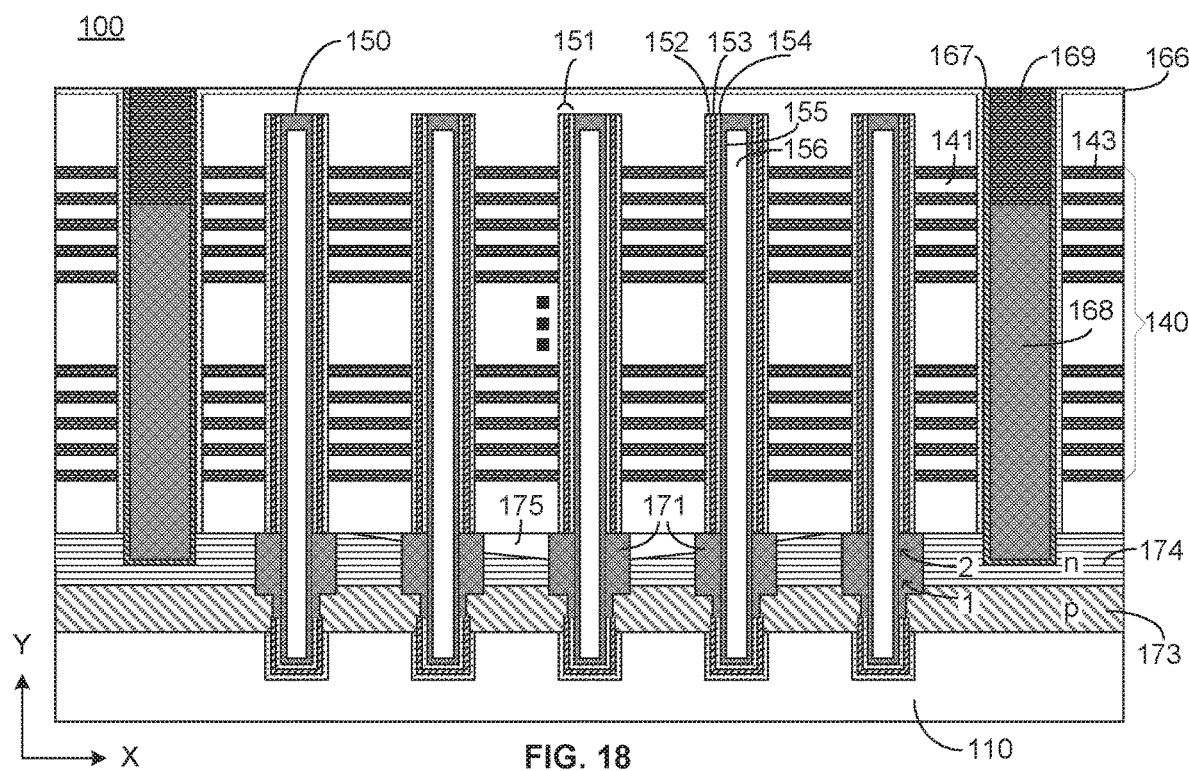

FIGS. 17 and 18 each schematically show a cross-sectional view of the 3D memory device 100 after additional fabrication steps are performed according to embodiments of the present disclosure. Following the third selective epitaxial growth, etch processes, such as selective wet etch processes, may be performed to remove the silicon oxide layer 1621 and the silicon nitride layer 161. Because the layers 142 of the layer stack 140 are also silicon nitride layers, the silicon nitride layers 142 are removed during the etch process for removing the silicon nitride layer 161, leaving cavities between the silicon oxide layers 141. Then, a conductive material such as W is grown to fill the cavities left by the removal of the layers 142, forming conductor layers 143 between the silicon oxide layers 141. That is, the conductor layers 143 replace the dielectric layers 142 and the layer stack 140 now includes alternating dielectric layers 141 and conductor layers 143, as shown in FIG. 17. The conductor layers 143 can be parallel to the substrate 110 and a portion of each functional layer 151 in a channel hole 150 is between a portion of one of the conductor layers 143 and a portion of the channel layer 155 in the channel hole 150. The conductive material may be deposited by CVD, PVD, ALD, or a combination of two or more of these processes. In some embodiments, another metal, such as Co, Cu, or Al, may be used as the conductive material for forming the conductor layers 143.

Each conductor layer 143 is configured to electrically connect one or more rows of NAND memory cells along the X direction or in the X-Z plane and is configured as a word line for the 3D memory device 100. The channel layer 155 formed in the channel hole 150 is configured to electrically connect a column or a string of NAND memory cells along the Y direction and is configured as a bit line for the 3D memory device 100. As such, a portion of the functional layer 151 in the X-Z plane in the channel hole 150, as a part of a NAND memory cell, is arranged between a conductor layer 143 and a channel layer 155, i.e., between a word line and a bit line. A portion of the conductor layer 143 that is around a portion of the channel hole 150 functions as a control gate for a NAND memory cell. The 3D memory device 100 as depicted in FIG. 17 can be considered as including a 2D array of strings of NAND cells (such a string is also referred to as a "NAND string"). Each NAND string contains multiple NAND cells and extends vertically toward the substrate 110. The NAND strings form a 3D arrangement of the NAND memory cells.

After the conductor layers 143 are formed, a silicon oxide layer 166 may be deposited on the 3D NAND memory device 100. The layer 166 may be deposited by CVD, PVD, ALD, or a combination of two or more of these processes. Then, a dry etch process or a combination of dry etch and wet etch processes may be performed to create an opening at the bottom of each GLS 160. As a result, a portion of the layer 166 and a portion of the layer 174 are removed.

The etch process exposes parts of the layer 174. Then, processes are performed to form the ACS's in the GLS's 160. The ACS's connect with the layer 174 electrically. As shown in FIG. 18, a conductive layer 167 including a conductive material such as titanium nitride, W, Co, Cu, Al, doped silicon, or silicide may be deposited to cover the silicon oxide sidewall and electrically contact the layer 174 at the bottom of the GLS 160. The GLS 160 may then be filled with a conductive material 168 such as doped polysilicon and sealed by a conductive plug 169 that may be made of a metal such as W, Co, Cu, or Al. After the GLS 160 is filled, it becomes an electrically conductive channel. Then, other fabrication steps or processes are performed to complete fabrication of the device 100.

Figures 19, 20:
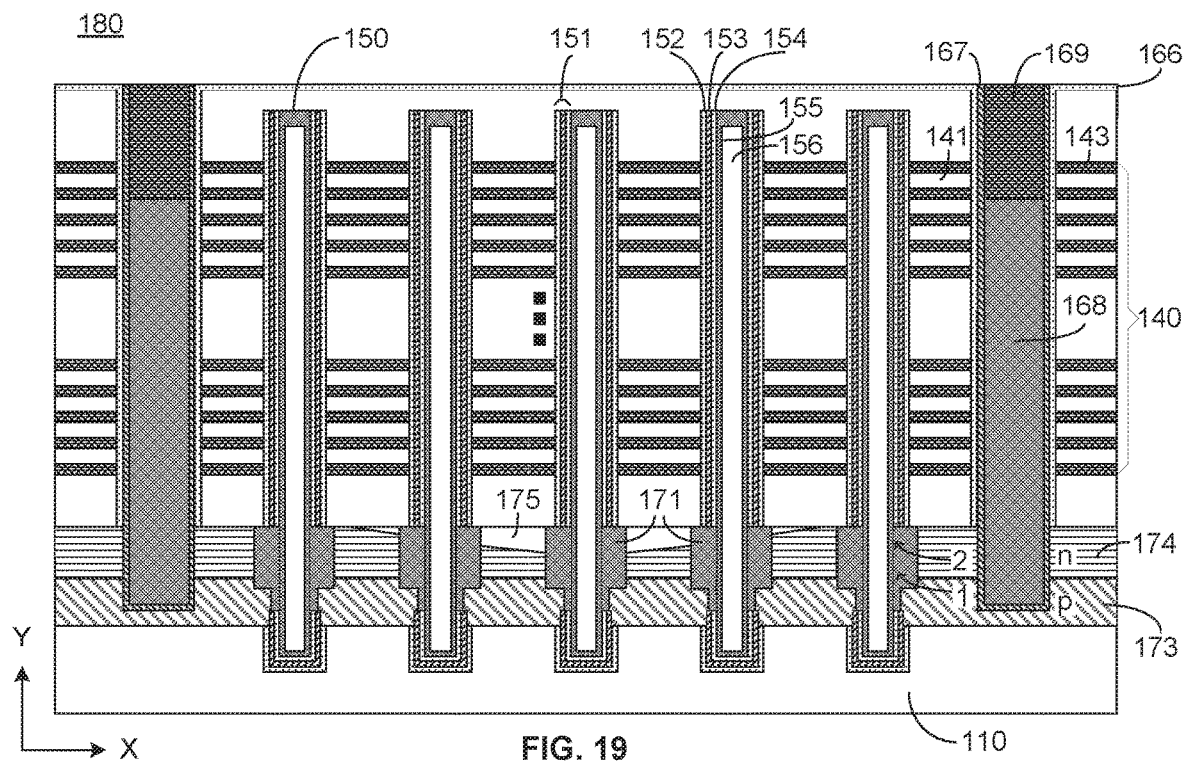
FIG. 19 illustrates schematically a cross-sectional view of another 3D memory device according to embodiments of the present disclosure.
FIG. 20 illustrates schematically a cross-sectional view of another 3D memory device in an exemplary fabrication process according to embodiments of the present disclosure.

FIG. 19 schematically shows a cross-sectional view of another 3D memory device 180 according to embodiments of the present disclosure. The device 180 shown in FIG. 19 may be fabricated using the same processes as those used to make the device 100 shown in FIG. 18. The structure of the device 180 shown in FIG. 19 is similar to that of the device 100 shown in FIG. 18, but the ACS of the device 180 extends through the n-doped layer 174 and into the p-doped layer 173, while the ACE of the device 100 only extends into the n-doped layer 174 and doesn't contact the layer 173 directly. As such, in the device 100 shown in FIG. 18, the ACS electrically contacts the n-doped layer 174. In the device 180 shown in FIG. 19, however, the ACS electrically contacts both the n-doped layer 174 and the p-doped layer 173. In both devices 100 and 180 as shown in FIGS. 18 and 19, the first electrical current path is configured in the layer 173 for the block erase operation and the second electrical current path is configured in the layer 174 for the read operation.

FIGS. 20-25 schematically show a fabrication process of another exemplary 3D memory device 200 according to embodiments of the present disclosure. The structure of the 3D memory device 200 can be similar to that of the device 100, but the 3D memory device 200 includes a single-layer cover layer 125 instead of the composite cover layer of the device 100 that includes the layers 121-124 of the device 100. In some embodiments, the layer 125 may include a material that cannot be etched by the etchants used to etch silicon oxide, silicon nitride, and polysilicon. In some embodiments, the etch rate of the material of the layer 125 in the etchants used during the fabrication for etching silicon oxide, silicon nitride, and polysilicon can be much slower, e.g., 10 times slower, than the etch rate for the etchants to etch silicon oxide, silicon nitride, and polysilicon. For example, the layer 125 may include aluminum oxide.

Figure 21:
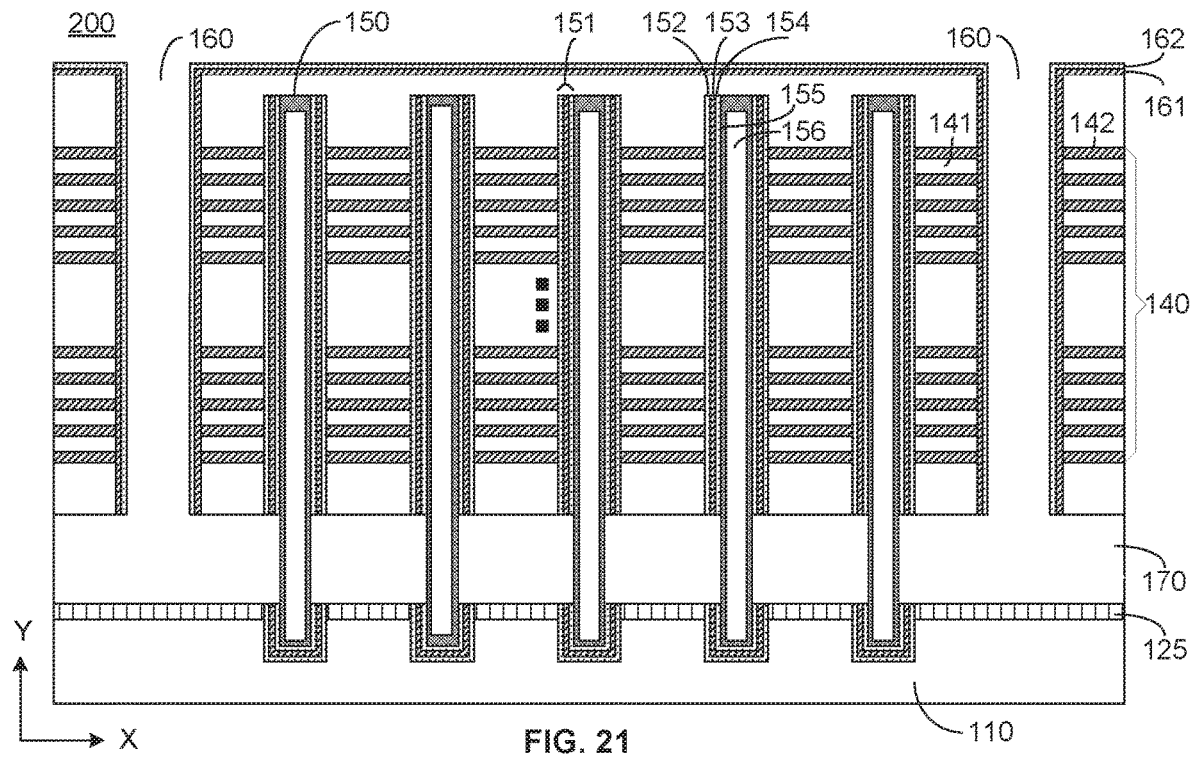
FIGS. 21-25 illustrate schematically cross-sectional views of the 3D memory device shown in FIG. 20 after several fabrication steps are performed according to embodiments of the present disclosure.

As shown in FIG. 20, when the 3D memory device 200 is fabricated, the cover layer 125 may be deposited over a top surface of the substrate 110 by CVD, PVD, ALD, or a combination of two or more of these processes. Next, similar to the device 100, a sacrificial layer, such as the polysilicon layer 130, and the layer stack 140 including alternating stack layers 141 and 142 are deposited sequentially over the cover layer 125. Similar to the device 100, the stack layers 141 and 142 of the device 200 also may exemplarily include silicon oxide and silicon nitride, respectively. As shown in FIG. 21, similar to the device 100, the device 200 also includes the channel holes 150, the functional layers 151, and the polysilicon channel layers 155 (semiconductor channels). The functional layers 151 are formed on the sidewalls of the channel holes 150 in the same way as that for the device 100. The functional layer 151 may exemplarily include a silicon oxide layer as the blocking layer 152 deposited on the sidewall of the channel hole 150, a silicon nitride layer as the storage layer 153 deposited on a surface of the blocking layer 152, and another silicon oxide layer as the tunnel insulation layer 154 deposited on a surface of the storage layer 153. The polysilicon channel layer 155 may be deposited on a surface of the tunnel insulation layer 154. The channel holes 150 may be filled with the dielectric material 156.

Next, the GLS 160 is formed and GLS spacers are deposited. The GLS spacers of the device 200 may, for example, include the same layers 161-165 as that of the device 100. Like for the device 100, multiple etch processes, e.g., multiple selective wet etch processes, are performed to remove the polysilicon layer 130, the layers 165, 164, and 163 of the GLS spacers, and exposed bottom portions of the blocking layers 152, the storage layers 153, and the tunnel insulation layers 154 in the cavity 170, respectively. Then, the portions of the polysilicon channel layers 155 or the polysilicon sidewalls in the cavity 170 are exposed, while the substrate 110 is still covered by the layer 125 at the bottom of the cavity 170, as shown in FIG. 21.

Figure 22:
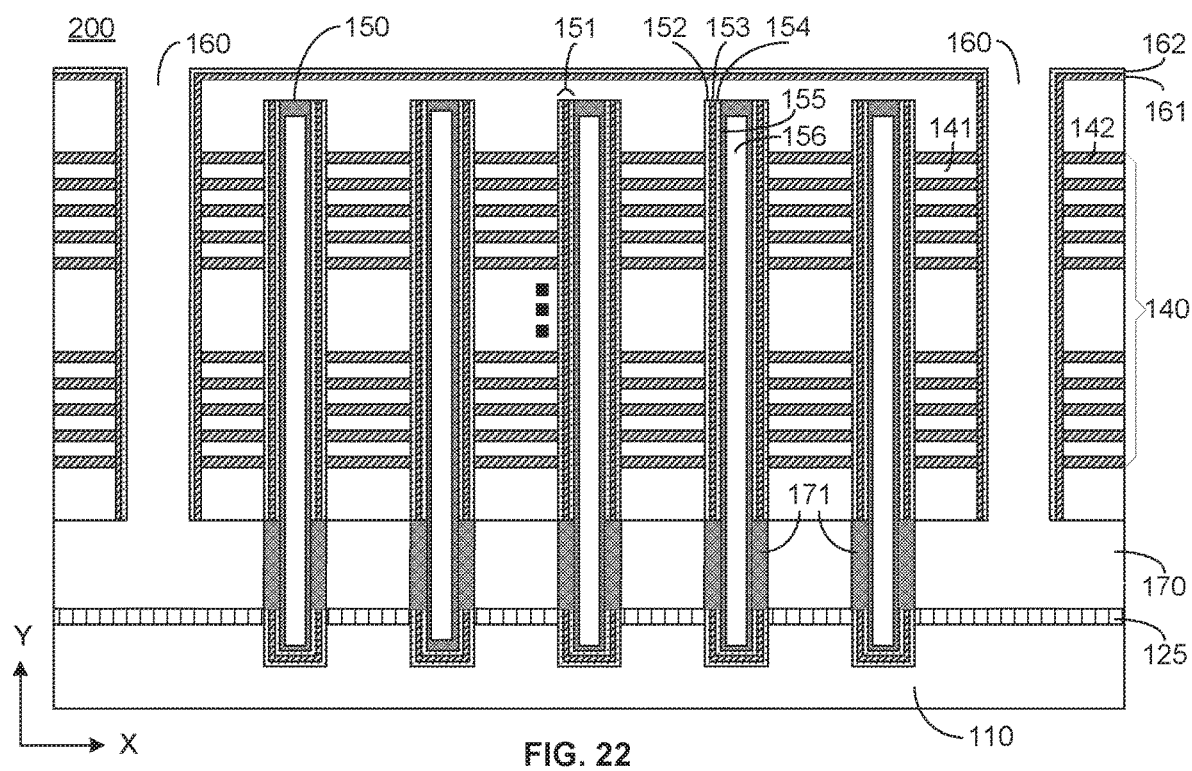
Figure 23:
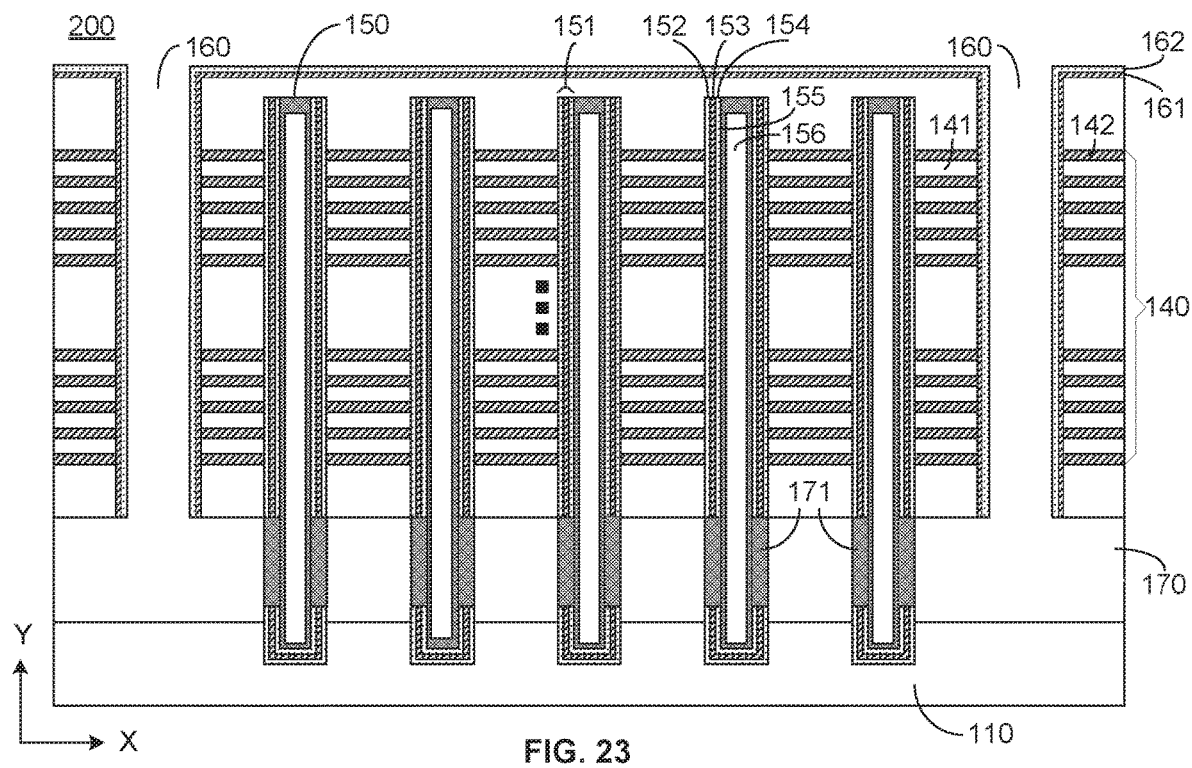

Like the fabrication processes for the device 100, a first selective epitaxial growth may be performed to only grow a polysilicon layer 171 on the polysilicon sidewalls in the cavity 170, as shown in FIG. 22. Similar to the device 100, the layer 171 may be undoped in some embodiments or lightly n-doped or p-doped in some other embodiments. Then the cover layer 125 may be etched away. An etch process, e.g., a selective wet etch process, may be conducted to remove the layer 125. As shown in FIG. 23, the top surface of the substrate 110 is exposed after the etch processes.

Figure 24:
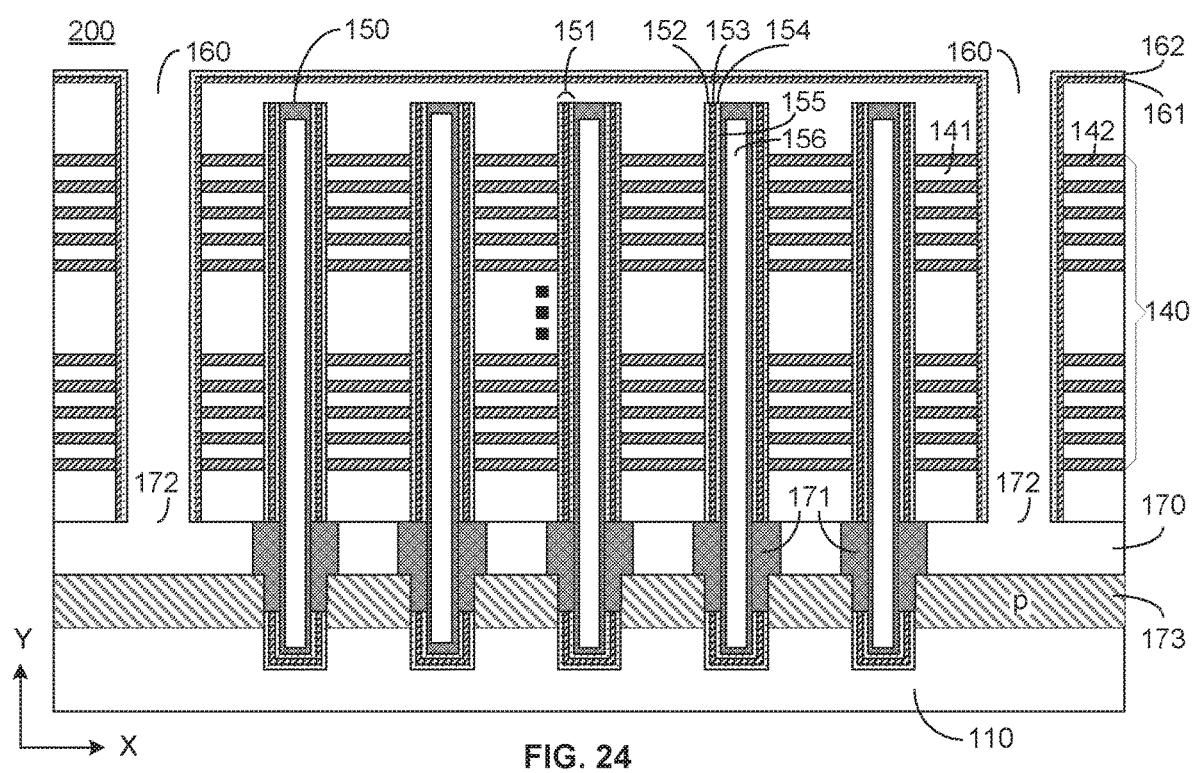

Thereafter, a second selective epitaxial growth is performed to thicken the polysilicon layer 171 on the polysilicon sidewalls of the cavity 170 and grow a single crystalline silicon layer 173 on the substrate 110 simultaneously, as shown in FIG. 24. Similar to the device 100, the parts of the layers 171 grown in the second selective growth and the layer 173 of the device 200 are p-doped. The layers 171 and 173 adjoin each other in regions close to the channel layers 155 and become electrically coupled.

As such, similar to the device 100, the layer 171 of the device 200 is grown by two subsequent processes of selective epitaxial growth and includes two parts corresponding to the two processes. In comparison, the layer 173 of the device 200 is formed in only one selective epitaxial growth.

Figure 25:
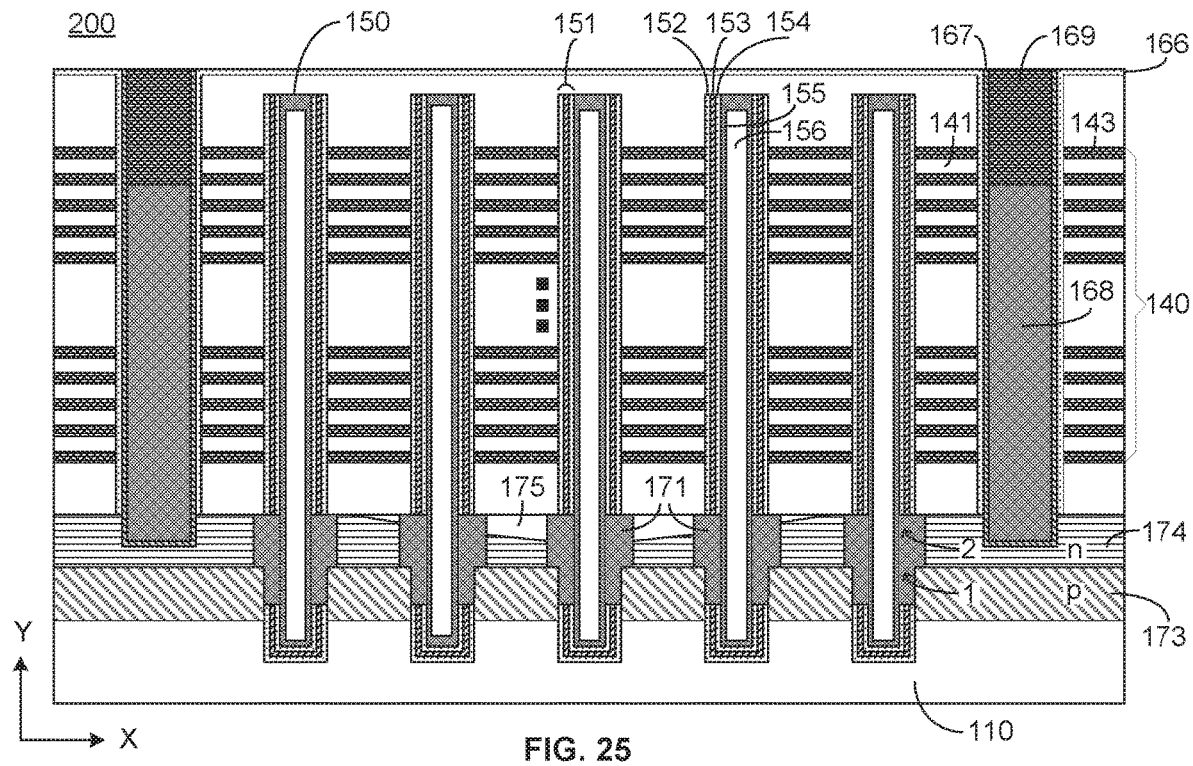

After the second selective epitaxial growth, similar to the device 100, a third selective epitaxial growth is performed. Polysilicon silicon is grown on the sidewalls to further thicken the layers 171, and another single crystalline silicon layer 174 is grown on the layer 173, as shown in FIG. 25. In the third selective epitaxial growth, the parts of the polysilicon layer 171 that are grown and the single crystalline layer 174 are n-doped. The layers 171 and 174 adjoin each other in regions close to the channel layers 155 and become electrically coupled. Similar to the device 100, when some parts of the layer 174 are grown to fill the openings 172, voids 175 are formed above some other parts of the layer 174, as shown in FIG. 25. Again, since the polysilicon layers 171 can be grown to reach a certain thickness in the first selective epitaxial growth, the electrical connection between the channel layers 155 and the ACS may be maintained despite the voids 175.

Similar to the device 100, the layers 173 and 174 of the device 200 electrically contact each other. In addition, both the layers 173 and 174 electrically contact the polysilicon layers 171. Since the layers 173 and 174 are p-doped and n-type respectively, the two separate electrical current paths are arranged. The first electrical current path, marked by "1" in FIG. 25, is in the layer 173, while the second electrical current path, marked by "2" in FIG. 25, is in the layer 174. Similar to the device 100, the first electrical current path is configured for the block erase operation of the 3D memory device 200. The second electrical current path is configured for the read operation. Because the read operation uses the second electrical current path in the n-doped layer 174 that is separate from the first electrical current path, the layer 173 (i.e., the p-well) is no longer needed to be negatively biased against a selected word line. As such, certain requirements for BSG may be removed and the device reliability may be improved.

After the third selective epitaxial growth, like for the device 100, etch processes, e.g., selective wet etch processes, may be performed to remove the silicon layer 162 and the silicon nitride layers 161 and 142. Cavities left by the layers 142 may be filled by metal such as W to form conductor layers. The conductor layers are configured as the word lines of the 3D memory device 200 and the channel layers 155 (the semiconductor channels) are configured as the bit lines. Like for the device 100, deposition of an oxide layer 166 and an etch process are used to expose the layer 174 at the bottom of the GLS 160 and electrically conductive materials are deposited to form the ACS. Then, the ACS electrically contacts the layer 174. After that, other fabrication steps or processes are performed to complete fabrication of the device 200.

Figure 26:
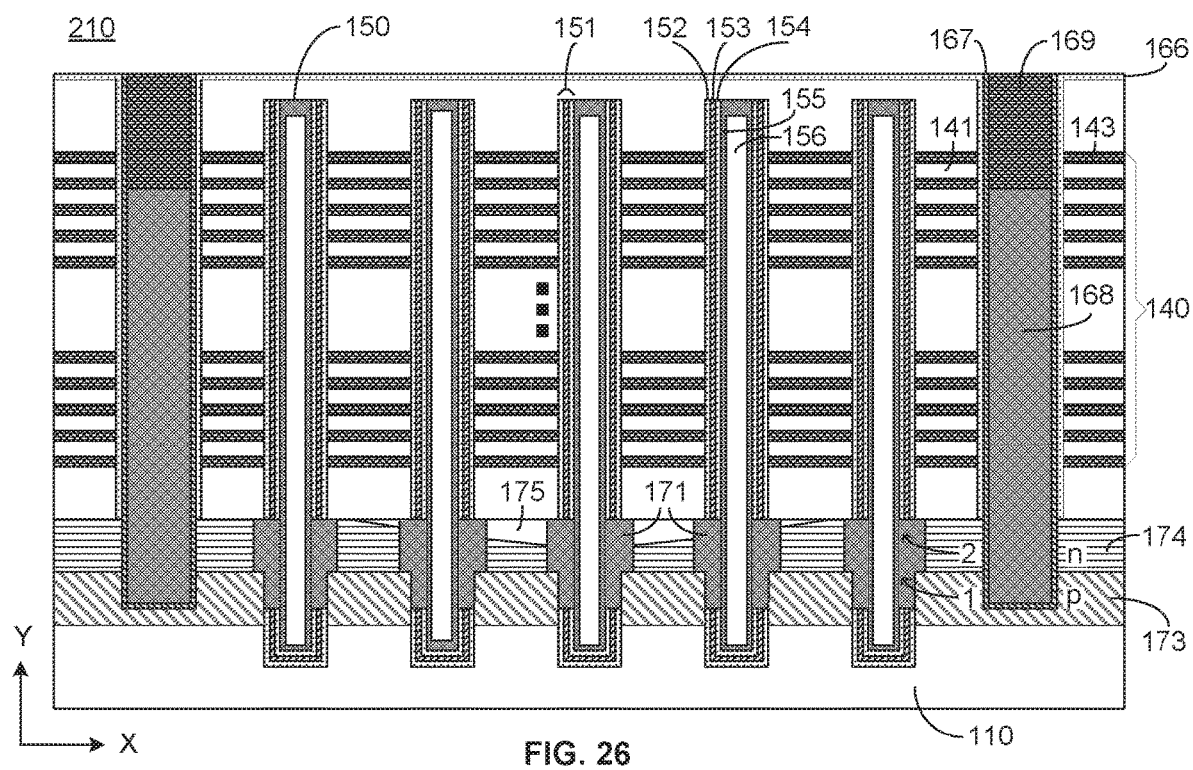
FIG. 26 illustrates schematically a cross-sectional view of another 3D memory device according to embodiments of the present disclosure.

FIG. 26 schematically shows a cross-sectional view of another 3D memory device 210 according to embodiments of the present disclosure. The device 210 shown in FIG. 26 may be fabricated using the same processes as those used to make the device 200 shown in FIG. 25. The structure of the device 210 shown in FIG. 26 is similar to that of the device 200 shown in FIG. 25, but the ACS in the device 210 extends through the n-doped layer 174 and into the p-doped layer 173, while the ACE in the device 200 only extends into the n-doped layer 174 and doesn't contact the layer 173 directly. As such, in the device 200 shown in FIG. 25, the ACS electrically contacts the n-doped layer 174 only. In the device 210 shown in FIG. 26, the ACS electrically contact both the n-doped layer 174 and the p-doped layer 173. In both devices 200 and 210 as shown in FIGS. 25 and 26, the first electrical current path is configured in the layer 173 for the block erase operation and the second electrical current path is configured in the layer 174 for the read operation.

Figure 27:
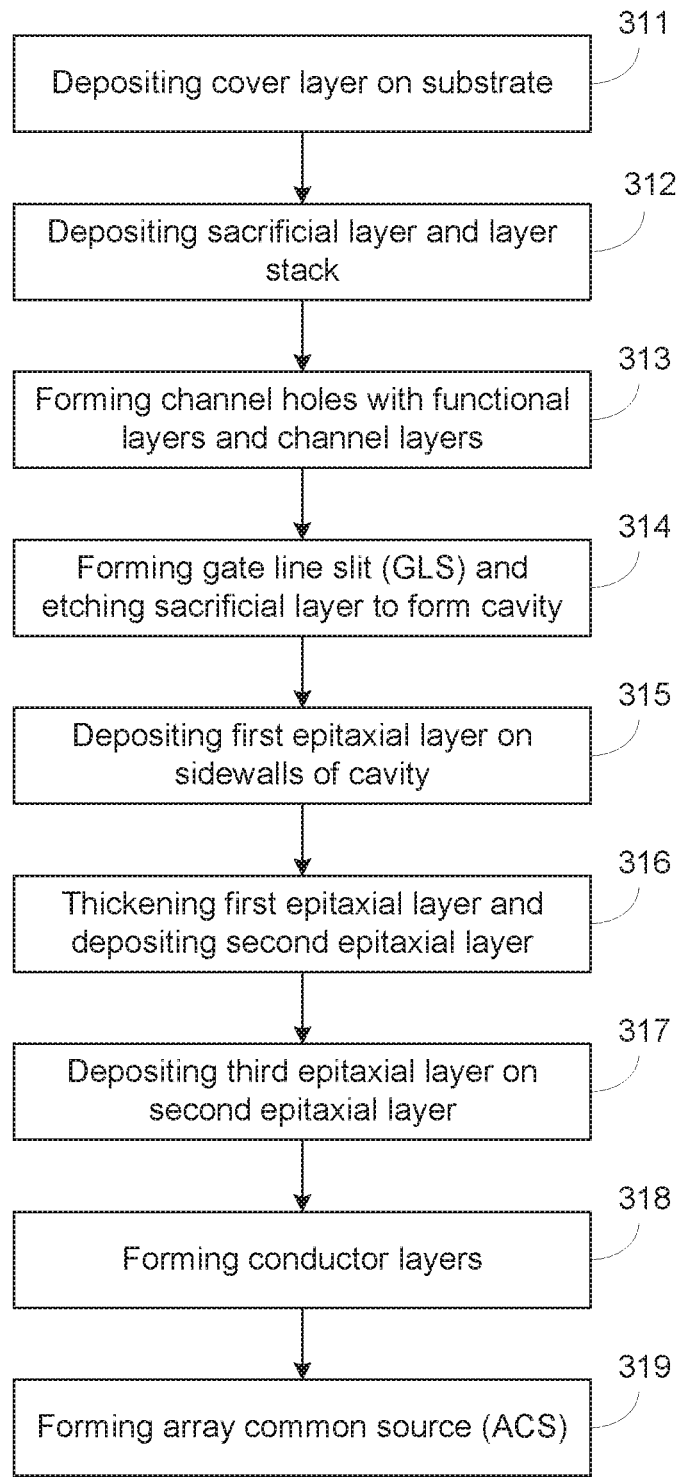
FIG. 27 illustrates a schematic flow chart of fabrication of a 3D memory device according to embodiments of the present disclosure.

FIG. 27 shows a schematic flow chart 300 for fabricating a 3D memory device according to embodiments of the present disclosure. At 311, a cover layer may be deposited over a top surface of a substrate. The substrate can include a semiconductor substrate, such as a single crystalline silicon substrate. In some embodiments, the cover layer can include a single aluminum oxide layer. In some other embodiments, the cover layer can include a composite layer including four layers deposited sequentially over the substrate. Among the four layers, the first and third layers may include silicon oxide and the second and fourth layers may include silicon nitride. In some other embodiments, the cover layer can have another configuration, depending on designs of the functional layer and the GLS spacers of the 3D memory device.

At 312, a sacrificial layer such as a polysilicon layer may be deposited on the cover layer. Next, a layer stack may be deposited above the sacrificial layer. The layer stack includes a first stack layer and a second stack layer that are alternately stacked. In some embodiments, the first stack layer may include a first dielectric layer and the second stack layer may include a second dielectric layer that is different than the first dielectric layer. In some other embodiments, the first and second stack layers may include a dielectric layer and an electrically conductive layer, respectively.

At 313, channel holes are formed through the layer stack, the sacrificial layer, and the cover layer to expose portions of the substrate. A functional layer and a channel layer are deposited on the sidewall of each channel hole. Forming the functional layer can include depositing a blocking layer on the sidewall of the channel hole, depositing a storage layer on the blocking layer, and depositing a tunnel insulation layer on the storage layer. The channel layer, deposited on the tunnel insulation layer, functions as a semiconductor channel and can include a polysilicon layer.

At 314, a GLS is formed that extends vertically through the layer stack and into the sacrificial layer, and exposes a portion of the sacrificial layer. Next, the sacrificial layer is etched away and a cavity is created above the cover layer. The cavity exposes a portion of the blocking layer of the functional layer and a portion of the cover layer. Then, the layers of the functional layer exposed sequentially in the cavity, including the blocking layer, the storage layer, and the tunnel insulation layer, are etched away by, e.g., one or more selective etch processes, respectively. As a result, a portion of the functional layer that is close to the substrate is removed to expose a side portion of the channel layer in the cavity. At least a portion of the cover layer is left and still covers the substrate.

At 315, a first selective epitaxial growth is performed to grow a first epitaxial layer on the exposed portion of the channel layer (i.e., the sidewall) in the cavity. Next, the cover layer on the substrate is removed by etching, e.g., a selective wet etch. A portion of the top surface of the substrate is exposed.

At 316, a second selective epitaxial growth is performed to simultaneously thicken the first epitaxial layer and deposit a p-doped second epitaxial layer on the portion of the substrate. The first epitaxial layer can be a polysilicon layer and the second epitaxial layer can be a single crystalline silicon layer.

At 317, a third selective epitaxial growth is performed to further thicken the first epitaxial layer and simultaneously deposit an n-doped third epitaxial layer on the second epitaxial layer. The first epitaxial layer remains to be a polysilicon layer and the third epitaxial layer can be a single crystalline silicon layer.

In some embodiments that the layer stack includes two dielectric stack layers, one of the first and second stack layers is etched away at 318 to leave cavities, which are then filled with an electrically conductive material to form conductor layers. The electrically conductive material may include a metal such as W, Co, Cu, or Al.

At 319, oxide layers are deposited and etched selectively at the GLS to expose the third epitaxial layer. Electrically conductive materials, such as titanium nitride, W, Cu, Al, and/or doped polysilicon are deposited in the GLS to form an ACS that electrically contacts the third epitaxial layer.

FIGS. 28-36 schematically show a fabrication process of another exemplary 3D memory device 400 according to embodiments of the present disclosure. The structure of the 3D memory device 400 can be similar to that of the devices 100 and 200, but the tunnel insulation layer in the device 400 is not silicon oxide.

As described in more detail below, in the exemplary fabrication process shown in FIGS. 28-36 for the device 400, the cover layer for shielding the substrate is grown after the cavity 170 is formed. For example, in the example shown in FIGS. 28-36, the tunnel insulation layer 154 is not a silicon oxide layer, but a layer with a high-k dielectric material. The high-k dielectric material used for depositing the tunnel insulation layer may include a material that cannot be etched by the etchants used to etch silicon oxide and silicon nitride. In some embodiments, the etch rate of the high-k dielectric material in the etchants used during the fabrication for etching silicon oxide and silicon nitride can be much slower, e.g., 10 times slower, than the etch rate for the etchants to etch silicon oxide and silicon nitride. For example, the high-k dielectric material may include aluminum oxide, which is exemplarily used in the following descriptions.

The fabrication method for the 3D NAND memory device 400 may use one or more processes that are the same as or similar to those used for the devices 100 and 200. For example, one or more deposition processes, one or more etch processes, and/or one or more filling processes used for the devices 100 and 200 may be used in the fabrication of the device 400. Description of such processes are omitted or not repeated in detail.

Figure 28:
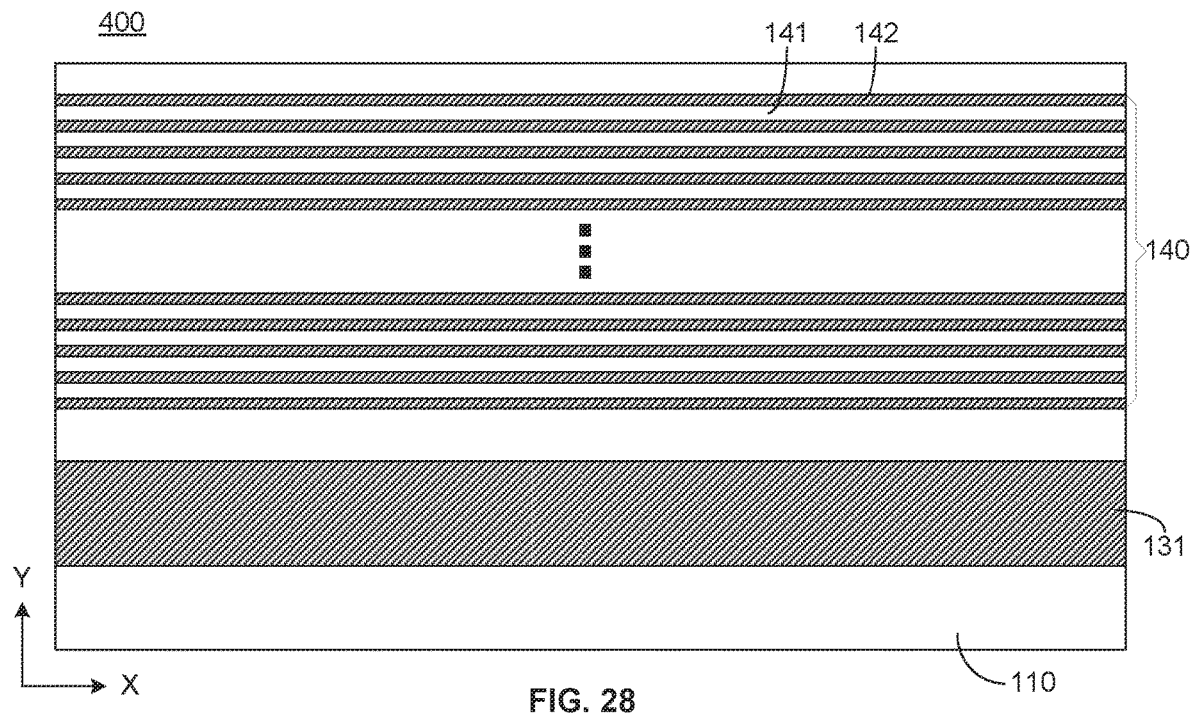
FIGS. 28-36 illustrate schematically cross-sectional views of the 3D memory device shown in FIG. 27 after several fabrication steps according to embodiments of the present disclosure.

Referring to FIG. 28, when the 3D memory device 400 is fabricated, a sacrificial layer 131 may be deposited over the substrate 110 without first depositing a cover layer. The sacrificial layer 131 may include a material, such as a dielectric material, a semiconductive material, or a conductive material, that has a high etch selectivity with respect to the material of the substrate 110. In the descriptions below, as an example, the layer 131 is a silicon nitride layer. Next, similar to the device 100, the layer stack 140 including alternating stack layers 141 and 142 is deposited over the sacrificial layer 131. Similar to the devices 100 and 200, the stack layers 141 and 142 in the device 400 may exemplarily include silicon oxide and silicon nitride, respectively.

Figure 29:
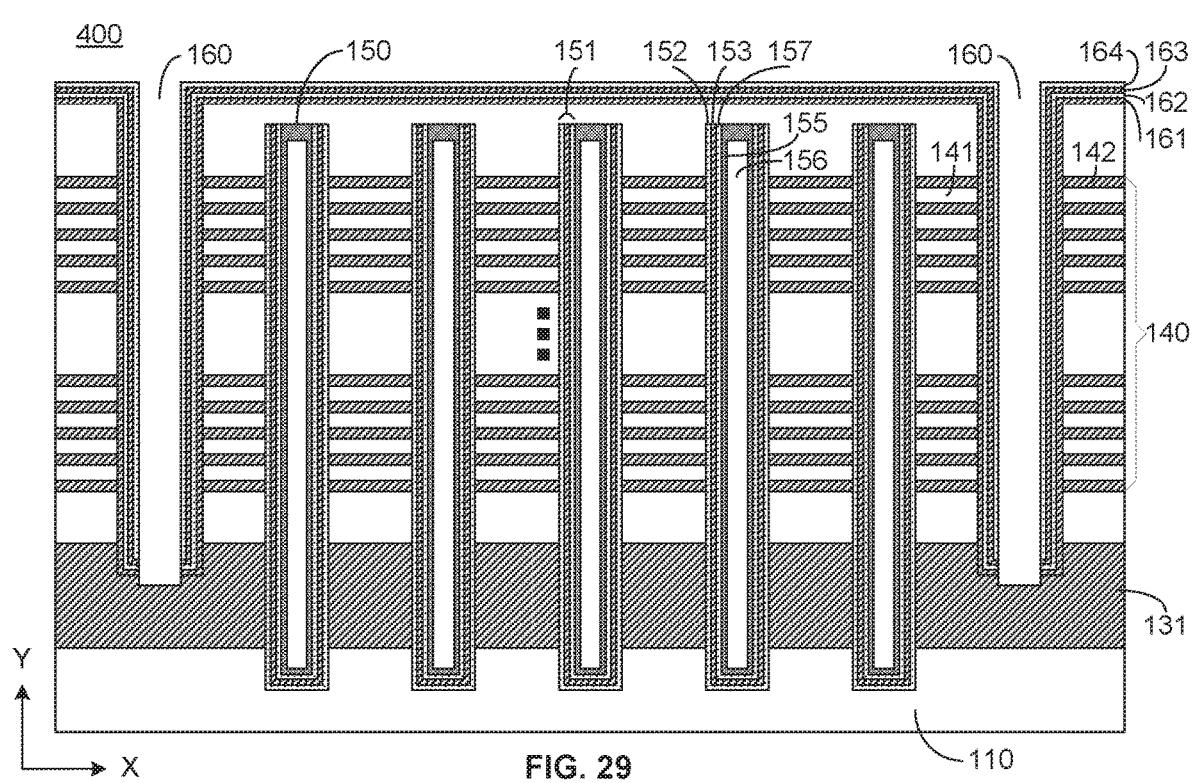

Referring to FIG. 29, similar to the device 100, the channel holes 150, the functional layers 151, and the polysilicon channel layers 155 (semiconductor channels) are formed sequentially in the device 400. The functional layers 151 are formed on the sidewalls of the channel holes 150 in a same or similar manner as that for the device 100. The functional layer 151 in the device 400 includes the blocking layer 152 deposited on the sidewall of the channel hole 150, the storage layer 153 deposited on a surface of the blocking layer 152, and a tunnel insulation layer 157 deposited on a surface of the storage layer 153. The blocking layer 152 can include, e.g., a silicon oxide layer, and the storage layer 153 can include a silicon nitride layer. Different from the tunnel insulation layer 154 in the exemplary devices described that includes a silicon oxide layer, the tunnel insulation layer 157 in the device 400 includes, for example, an aluminum oxide layer. Then, the polysilicon channel layer 155 may be deposited on a surface of the tunnel insulation layer 157. The channel hole 150 may be filled with the dielectric material 156.

As shown in FIG. 29, the GLS 160 is formed and GLS spacers are deposited. The GLS spacers of the device 400 may, for example, include four layers instead of five layers in the device 100. The device 400 may include the same layers 161, 162, 163, and 164 as those in the device 100, but not the layer 165. For example, the layers 161 and 163 are silicon nitride and the layers 162 and 164 are silicon oxide. The bottom portions of the layers 161-164 in the GSL 160 are removed by a first etch process, such as a dry etch or a combination of dry and wet etch processes, which exposes the layer 131.

Figure 30:
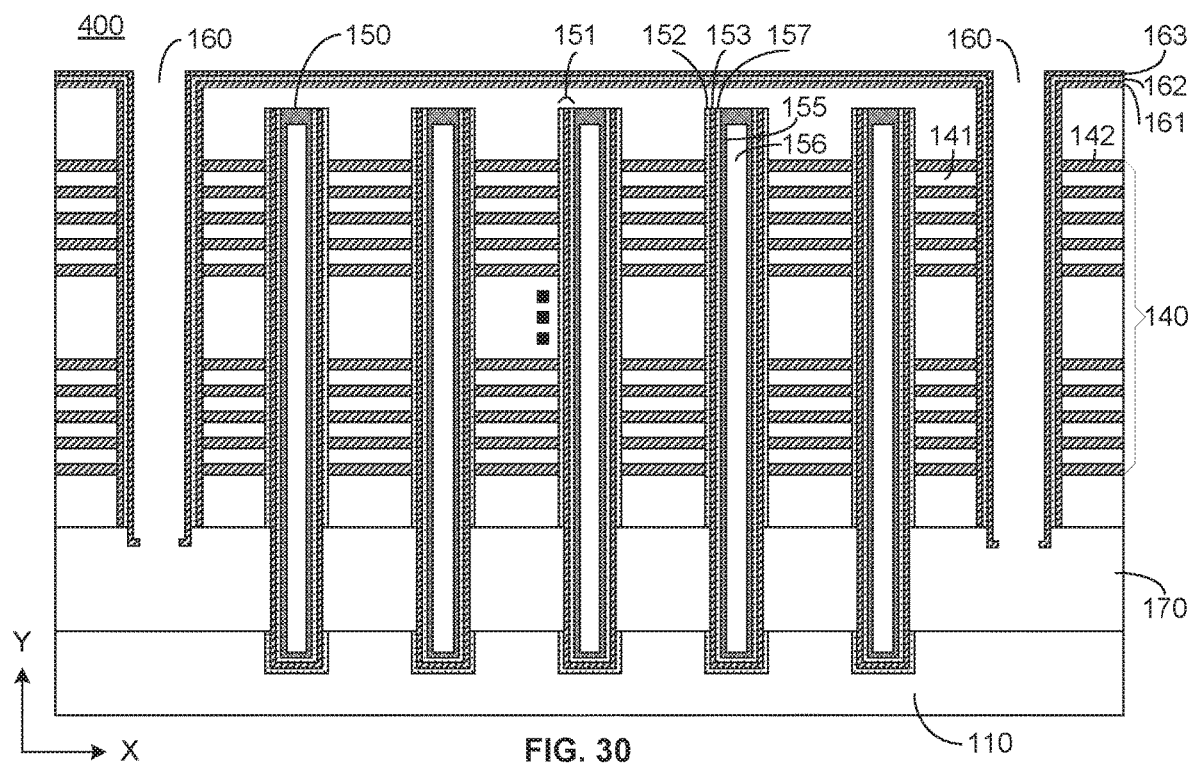

After the layer 131 is exposed, a second etch process, which may, for example, include two selective wet etch processes, is performed to etch silicon nitride materials and silicon oxide materials sequentially. As a result, the silicon nitride sacrificial layer 131 and the silicon oxide layer 164 are etched away and the cavity 170 is formed, as shown in FIG. 30. Removal of the sacrificial layer 131 exposes portions of the blocking layer 152 in the cavity 170. As the blocking layer 152 is also silicon oxide, the exposed portions of the layers 152 in the cavity 170 are also etched away in the second etch process.

Figure 31:
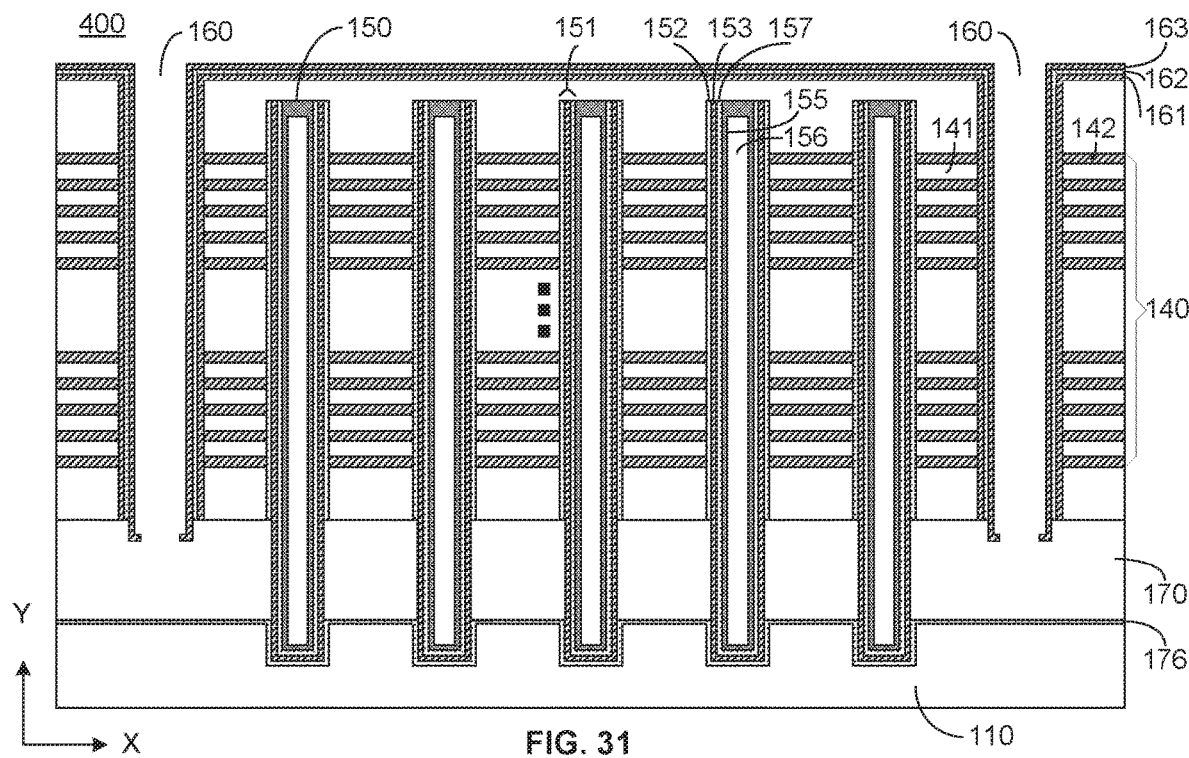

As shown in FIG. 30, removal of the sacrificial layer 131 exposes the top surface of the substrate 110. Next, an oxidation process is performed to grow a silicon oxide layer 176 over the substrate 110, as shown in FIG. 31. The silicon oxide layer 176 is configured as the cover layer.

Figure 32:
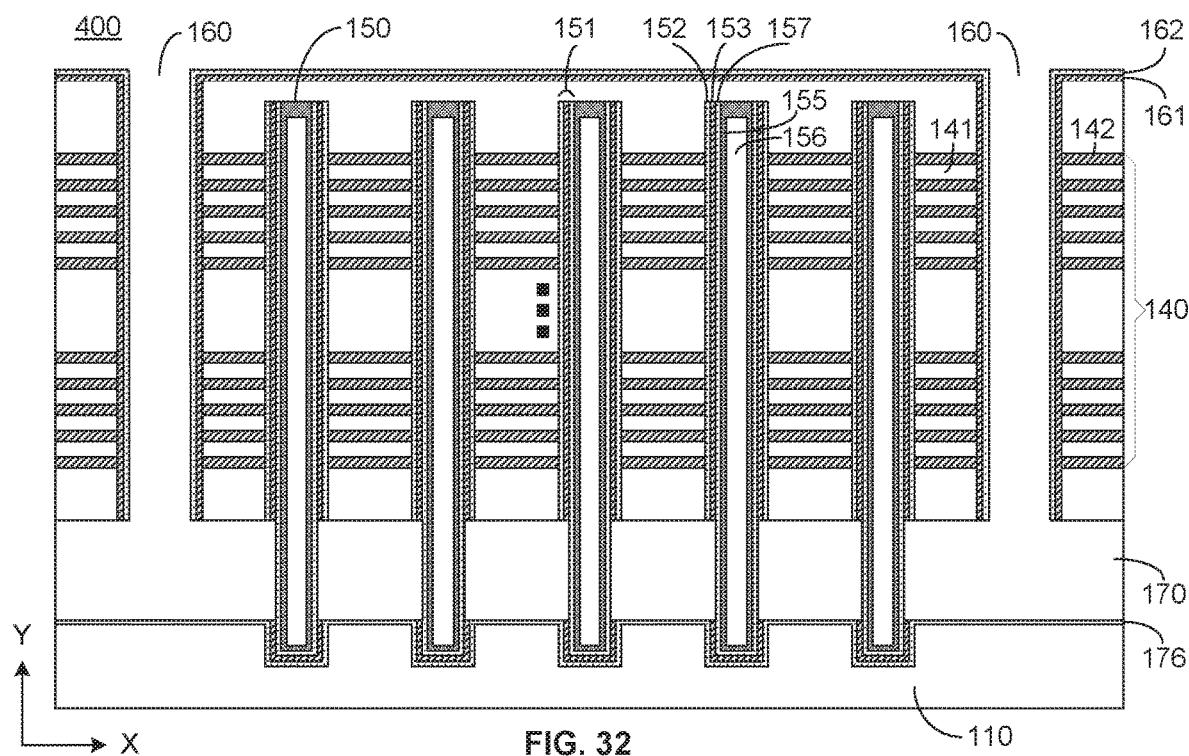
Figure 33:
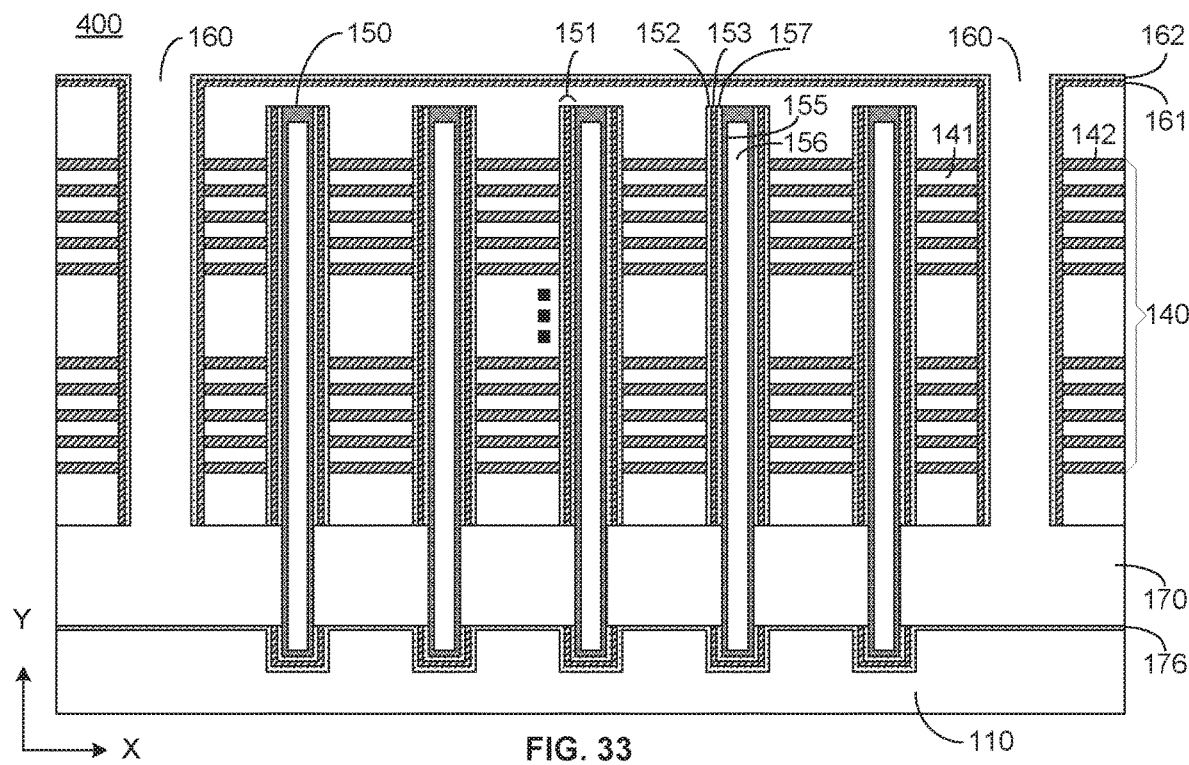

After the oxidation process, a third etch process, e.g., a selective wet etch process, is performed to etch silicon nitride materials. The layer 163 and exposed portions of the storage layers 153 in the cavity 170 are etched away. As a result, portions of the tunnel insulation layer 157, i.e., portions of the aluminum oxide layers, are exposed in the cavity 170, as shown in FIG. 32. Next, a fourth etch process, e.g., a selective wet etch process, is performed to etch away the aluminum oxide materials. As a result, as shown in FIG. 33, portions of the polysilicon channel layers 155 (the polysilicon sidewalls) in the cavity 170 are exposed after the fourth etch process, while the substrate 110 is still covered by the cover layer 176 at the bottom of the cavity 170.

Figure 34:
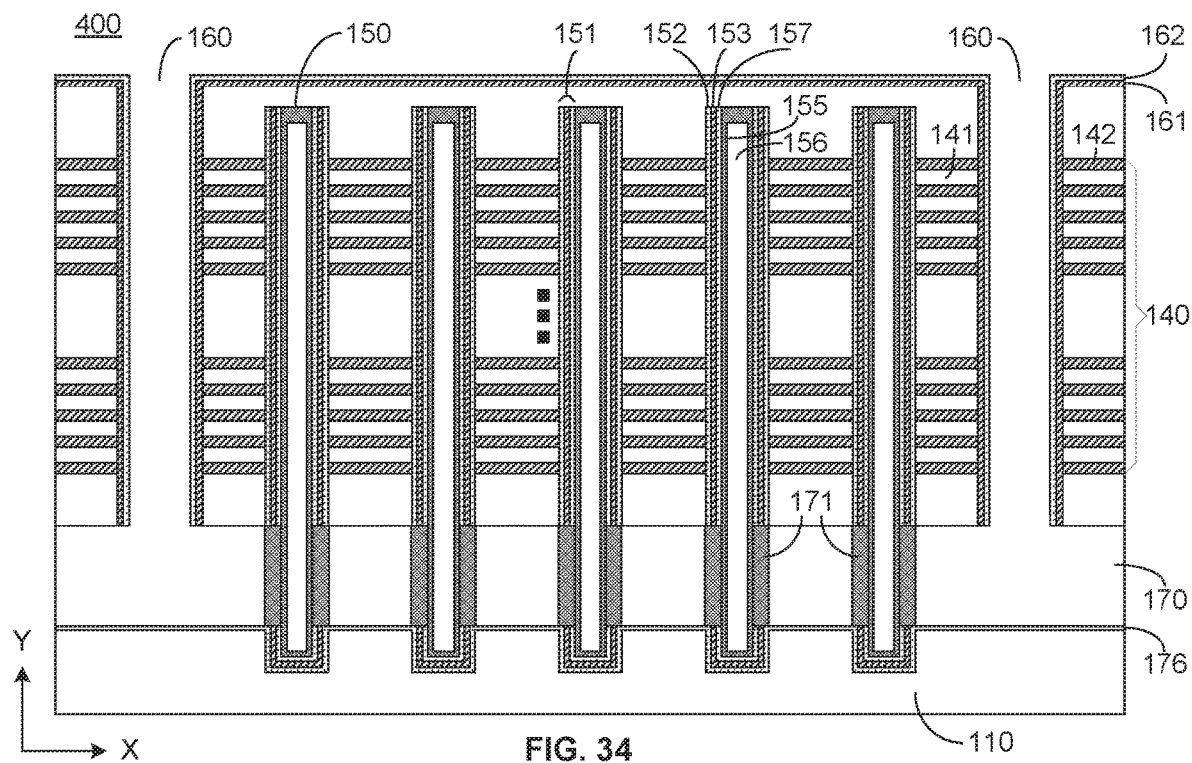

Thereafter, similar to the fabrication processes for the devices 100 and 200, a first selective epitaxial growth may be performed to only grow a polysilicon layer 171 on the polysilicon sidewalls in the cavity 170, as shown in FIG. 34. Similar to the device 100, the polysilicon layer 171 may be undoped or lightly doped with p-type or n-type dopants. Then the silicon oxide cover layer 176 may be etched out in a fifth etch process, e.g., a selective wet etch process. The top surface of the substrate 110 becomes exposed after the fifth etch process. In some embodiments, the layer 176 is configured sufficiently thinner than the layer 162. Then, only a part of the layer 162 may be removed by the fifth etch process. The remaining part of the layer 162 may form a layer 1621.

Figure 35:
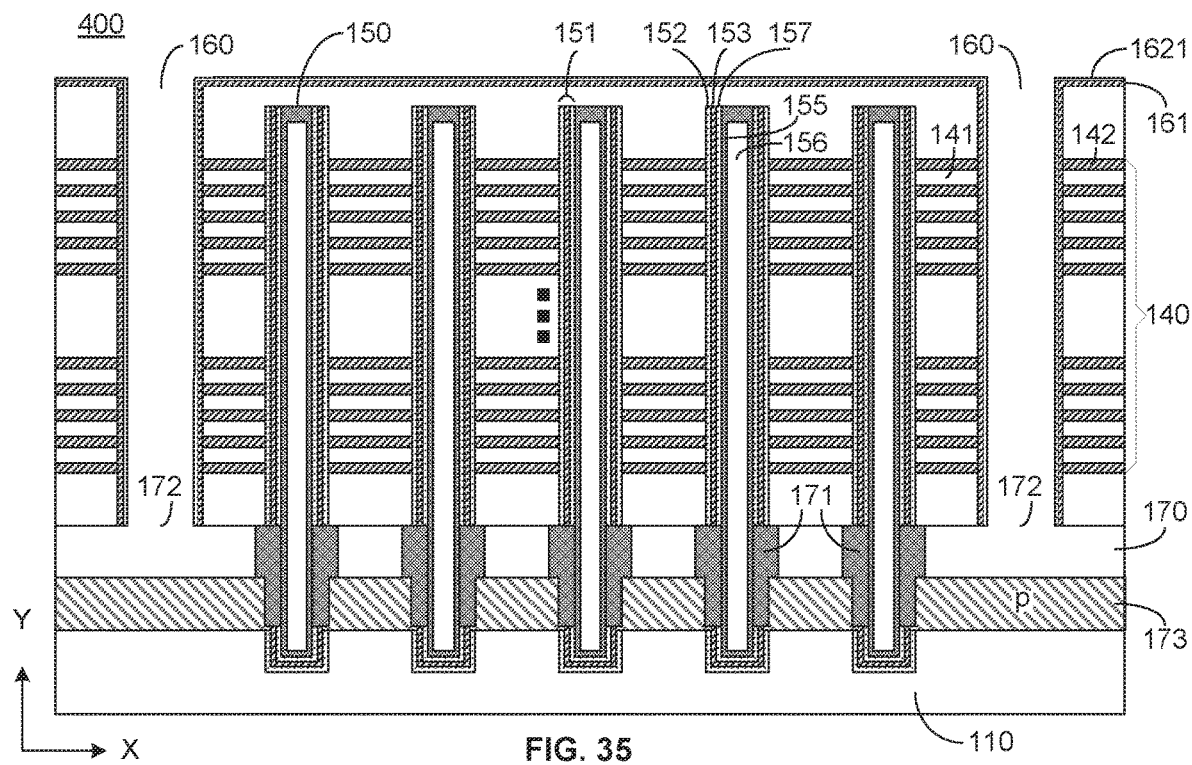

Similar to the devices 100 and 200, a second selective epitaxial growth is performed to thicken the polysilicon layer 171 on the polysilicon sidewalls in the cavity 170 and simultaneously grow a single crystalline silicon layer 173 on the substrate 110, as shown in FIG. 35. Similar to the devices 100 and 200, the portions of the layer 171 that are grown in the second growth and the layer 173 of the device 400 are doped with p-type dopants. The layers 171 and 173 adjoin each other in regions close to the channel layers 155 and become electrically coupled.

Figure 36:
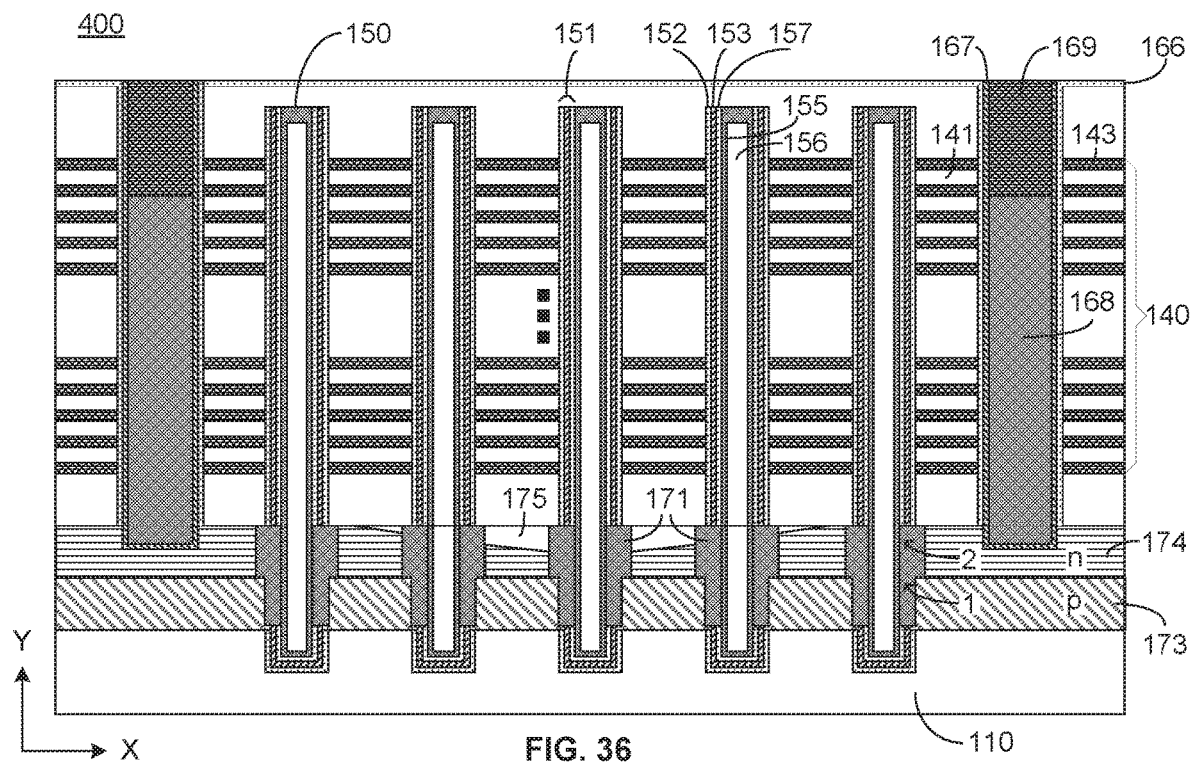

Next, similar to the devices 100 and 200, a third selective epitaxial growth is performed to further thicken the polysilicon layer 171 on the polysilicon sidewalls in the cavity 170 and simultaneously grow a single crystalline silicon layer 174 on the layer 173, as shown in FIG. 36. Similar to the devices 100 and 200, the portions of the layer 171 that are grown in the third growth and the layer 174 of the device 400 are doped with n-type dopants. The layers 171 and 174 adjoin each other in regions close to the channel layers 155 and become electrically coupled.

Similar to the devices 100 and 200, when some parts of the layer 174 are grown to fill the openings 172, voids 175 are formed above some other parts of the layer 174, as shown in FIG. 36. Again, since the polysilicon layers 171 can be grown to reach a certain thickness in the first selective epitaxial growth, the electrical connection between the channel layers 155 and the ACS may be maintained despite the voids 175.

Similar to the devices 100 and 200, the layers 173 and 174 of the device 400 electrically contact each other. In addition, both the layers 173 and 174 electrically contact the polysilicon layers 171. Since the layers 173 and 174 are p-doped and n-doped respectively, two separate electrical current paths are arranged. The first electrical current path, marked by "1" in FIG. 36, is in the layer 173, while the second electrical current path, marked by "2" in FIG. 36, is in the layer 174. Similar to the devices 100 and 200, the first electrical current path is configured for the block erase operation of the 3D memory device 400. The second electrical current path is configured for the read operation of the device 400. Because the read operation uses the second electrical current path in the n-doped layer 174 that is separate from the first electrical current path, the layer 173 (i.e., the p-well) is no longer needed to be negatively biased against a selected word line. As such, certain requirements for BSG may be removed and the device reliability may be improved.

After the third selective epitaxial growth, a sixth etch process, e.g., a selective wet etch process, is performed to remove the silicon oxide layer 1621 and the silicon nitride layers 161 and 142. Cavities left by the layers 142 are filled by metal such as W to form the conductor layers 143. The conductor layers are configured as the word lines of the 3D memory device 400 and the channel layers 155 (the semiconductor channels) are configured as the bit lines. Similar to the devices 100 and 200, silicon oxide deposition and etch processes may be used to expose the layer 174 at the bottom of the GLS 160 and electrically conductive materials may be deposited to form the ACS that electrically contacts the layer 174. After that, other fabrication steps or processes are performed to complete fabrication of the device 400.

Figure 37:
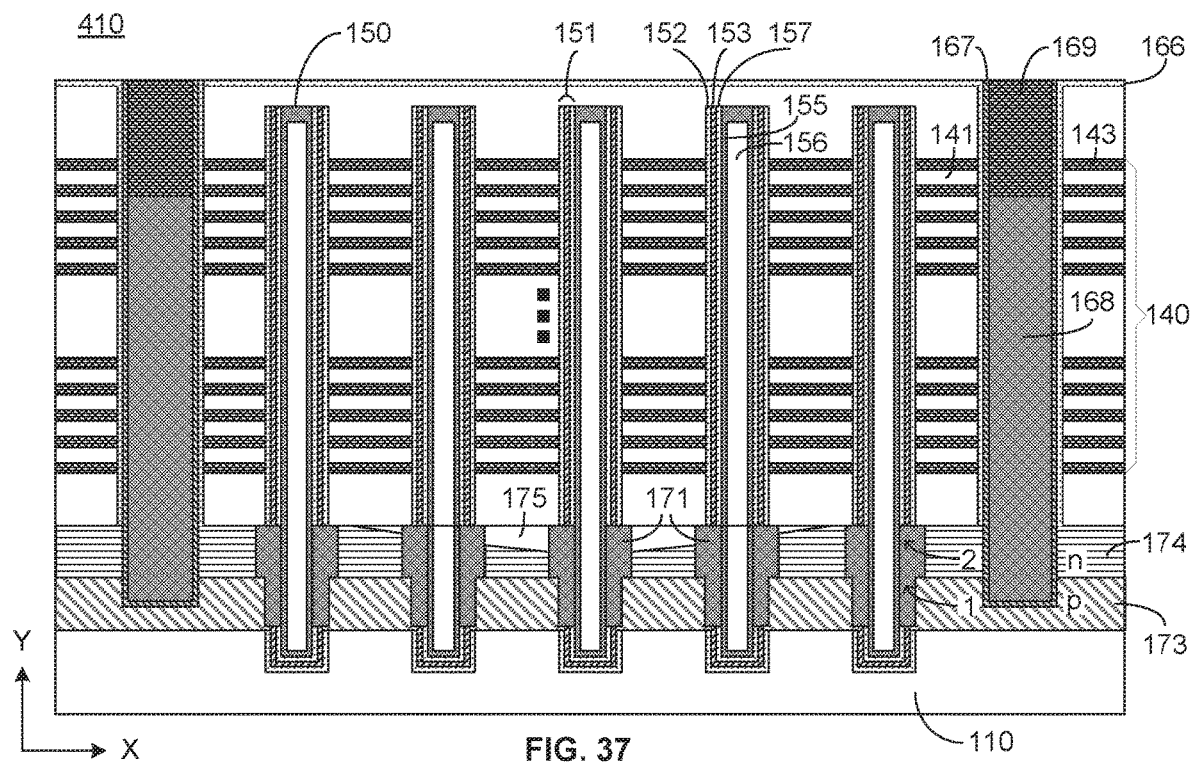
FIG. 37 illustrates schematically a cross-sectional view of another 3D memory device according to embodiments of the present disclosure.

FIG. 37 schematically shows a cross-sectional view of another 3D memory device 410 according to embodiments of the present disclosure. The device 410 shown in FIG. 37 may be fabricated using the same processes as those used to make the device 400 shown in FIG. 36. The structure of the device 410 shown in FIG. 37 is similar to that of the device 400 shown in FIG. 36, but the ACS in the device 410 extends through the n-doped layer 174 and into the p-doped layer 173, while the ACE in the device 400 only extends into the n-doped layer 174 and doesn't contact the layer 173 directly. As such, in the device 400 shown in FIG. 36, the ACS electrically contacts the n-doped layer 174 only. In the device 410 shown in FIG. 37, the ACS electrically contacts both the n-doped layer 174 and the p-doped layer 173. In both devices 400 and 410 as shown in FIGS. 36 and 37, the first electrical current path is configured in the layer 173 for the block erase operation and the second electrical current path is configured in the layer 174 for the read operation.

In some embodiments, after the n-doped layer 174 is deposited by the third selective epitaxial growth for the above-described devices, such as the devices 100, 200, and/or 400, a diffusion process may be performed. For example, the device may be baked at an elevated temperature in a diffusion process. The diffusion process may expand the n-doped region in the device. For example, the diffusion process may be configured to cause some portions of the polysilicon layer 171 that are adjacent to n-doped regions to convert to or from a p-doped region to an n-doped region.

In some embodiments, when the above-described devices such as the devices 100, 180, 200, 210, 400, and 410 are fabricated, the second selective epitaxial growth may grow an n-type epitaxial layer on the substrate and the third selective epitaxial growth may grow a p-type epitaxial layer on the n-type epitaxial layer. In such a scenario, the layer 173 becomes n-doped and the layer 174 becomes p-doped or becomes a p-well. The first electrical current path in the layer 173 and second electrical current path in the layer 174 are still separate and may be configured for the read operation and the block erase operation, respectively.

By using the disclosed memory structures and methods, a p-doped layer is grown on the substrate and an n-doped layer is grown on the p-doped layer in a 3D memory device. The p-doped layer is configured for a first electrical current path used in the block erase operation of the 3D memory device. The n-doped layer is configured for a second electrical current path used in the read operation of the 3D memory device. Since the erase operation and read operation use two separate electrical current paths, the p-doped layer (i.e., the p-well) is not required to be negatively biased against a word line during the read operation. As such, the requirements for BSG may be reduced and the device reliability may be improved.

Although the principles and implementations of the present disclosure are described by using specific embodiments in the specification, the foregoing descriptions of the embodiments are only intended to help understand the present disclosure. In addition, features of aforementioned different embodiments may be combined to form additional embodiments. A person of ordinary skill in the art may make modifications to the specific implementations and application range according to the idea of the present disclosure. Hence, the content of the specification should not be construed as a limitation to the present disclosure.

What is claimed is:

1. A three-dimensional (3D) memory device, comprising:
   a substrate;
   a layer stack over the substrate, the layer stack including a plurality of first stack layers and a plurality of second stack layers alternately stacked;
   a first epitaxial layer on a side portion of a channel layer that extends through the layer stack;
   a second epitaxial layer on the substrate; and
   a third epitaxial layer on the second epitaxial layer, wherein the second epitaxial layer and the third epitaxial layer are doped with different types of dopants, the second epitaxial layer is configured to provide a first electrical current path for an erase operation of the 3D memory device, and the third epitaxial layer is configured to provide a second electrical current path for a read operation of the 3D memory device.

2. The device according to claim 1, further comprising:

a functional layer adjacent to the channel layer, wherein the functional layer includes a blocking layer, a storage layer, and/or a tunnel insulation layer.

3. The device according to claim 1, wherein the plurality of first stack layers includes an electrically conductive material.

4. The device according to claim 1, further comprising:

an electrically conductive channel that extends through the layer stack and electrically contacts one of the second epitaxial layer and the third epitaxial layer or both the second epitaxial layer and the third epitaxial layer.

5. The device according to claim 1, wherein the second epitaxial layer is doped with p-type dopants and the third epitaxial layer is doped with n-type dopants.

6. The device according to claim 1, wherein the first epitaxial layer and the second epitaxial layer adjoin each other and provide the first electrical current path for the erase operation.

7. The device according to claim 1, wherein the first epitaxial layer and the third epitaxial layer adjoin each other and provide the second electrical current path for the read operation.

8. The device according to claim 1, wherein a thickness of the first epitaxial layer is unrelated to a thickness of the second epitaxial layer or the third epitaxial layer.

* * * * *